United States Patent
Hashimoto

(10) Patent No.: US 9,053,807 B2
(45) Date of Patent: Jun. 9, 2015

(54) NON-VOLATILE SEMICONDUCTOR MEMORY DEVICE

(71) Applicant: KABUSHIKI KAISHA TOSHIBA, Tokyo (JP)

(72) Inventor: Toshifumi Hashimoto, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/194,608

(22) Filed: Feb. 28, 2014

(65) Prior Publication Data
US 2015/0063027 A1 Mar. 5, 2015

(30) Foreign Application Priority Data
Sep. 2, 2013 (JP) ................................. 2013-180932

(51) Int. Cl.
G11C 11/34 (2006.01)
G11C 16/26 (2006.01)

(52) U.S. Cl.
CPC ...................................... *G11C 16/26* (2013.01)

(58) Field of Classification Search
USPC .................................................... 365/185.11
See application file for complete search history.

(56) References Cited

U.S. PATENT DOCUMENTS

| 6,070,804 | A | * | 6/2000 | Miyamoto | 235/494 |
| 6,314,028 | B1 | * | 11/2001 | Kono | 365/189.09 |
| 7,852,675 | B2 | | 12/2010 | Maejima | |
| 8,372,720 | B2 | | 2/2013 | Fukuzumi et al. | |
| 2009/0267128 | A1 | | 10/2009 | Maejima | |
| 2010/0124111 | A1 | * | 5/2010 | Suzuki et al. | 365/185.03 |
| 2011/0284946 | A1 | | 11/2011 | Kiyotoshi | |
| 2013/0265829 | A1 | * | 10/2013 | Suzuki | 365/185.22 |

FOREIGN PATENT DOCUMENTS

JP 2013-004128 A 1/2013

* cited by examiner

*Primary Examiner* — Hoai V Ho
*Assistant Examiner* — Pablo Huerta
(74) *Attorney, Agent, or Firm* — Patterson & Sheridan, LLP

(57) ABSTRACT

A non-volatile semiconductor device includes a memory array including a plurality of memory cell transistors electrically connected between bit lines and source lines, wherein the memory array is partitioned into a plurality of memory blocks, and a source line driver configured to set a voltage level of the source lines to a reference voltage level. First and second wirings are respectively connected to a first monitoring position of the source lines and a second monitoring position of the source lines different from the first monitoring position. A selection circuit selects between the first and second monitoring positions. A source line voltage control circuit compares a source line voltage at a selected monitoring position, and outputs a result to the source line driver.

20 Claims, 23 Drawing Sheets

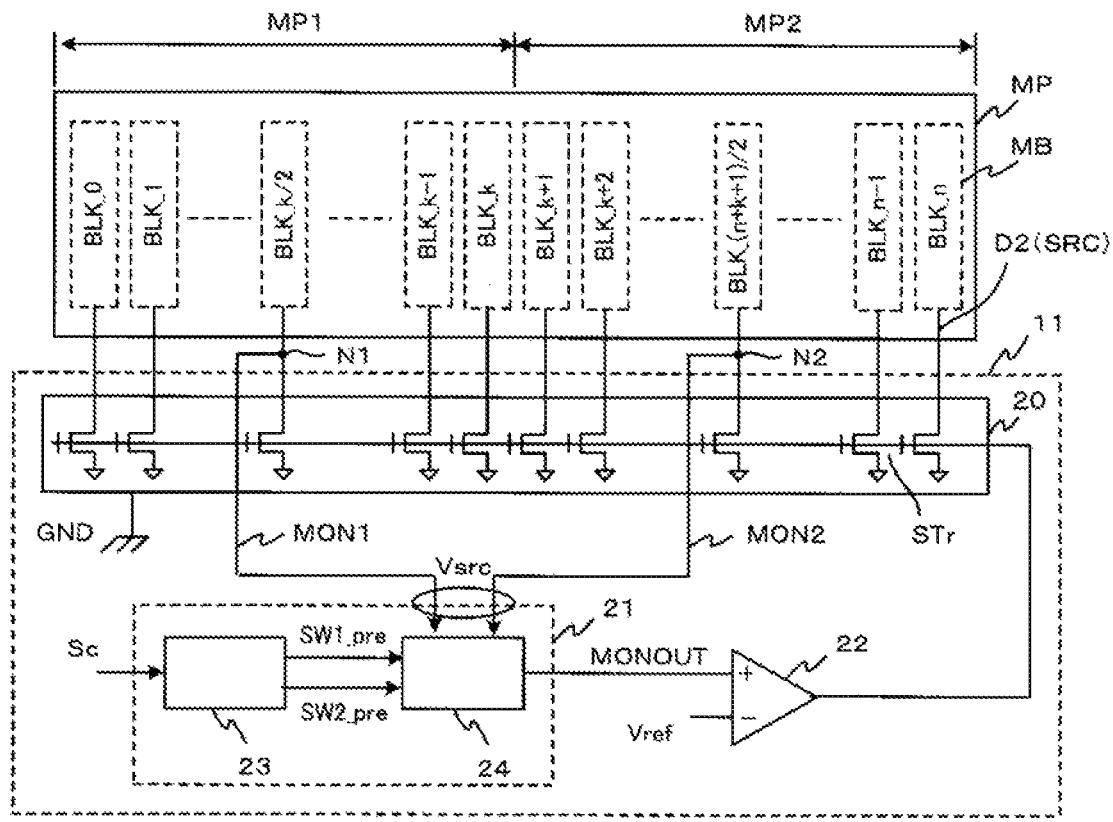

$V_{src}(x, y) = f(x) + g(y)$

62: SOURCE LINE MONITORING POSITION SELECTION CIRCUIT

| SELECTION BLOCK | SW1_pre | SW2_pre | SW3_pre |
|---|---|---|---|
| BLK_0 TO BLK_k | H | L | L |
| BLK_k+1 TO BLK_m | L | H | L |
| BLK_m+1 TO BLK_n | L | L | H |

NON-VOLATILE SEMICONDUCTOR MEMORY DEVICE

CROSS-REFERENCE TO RELATED APPLICATION

This application is based upon and claims the benefit of priority from Japanese Patent Application No. 2013-180932, filed Sep. 2, 2013, the entire contents of which are incorporated herein by reference.

FIELD

Embodiments described herein relate generally to a non-volatile semiconductor memory device.

BACKGROUND

A stacked NAND flash memory is known as one type of a non-volatile semiconductor memory device.

DESCRIPTION OF THE DRAWINGS

FIG. 7 is a diagram showing a source line control circuit of the non-volatile semiconductor memory device according to the first embodiment.

FIG. 8 is a diagram showing a decode result of a decode circuit of a source line monitoring position selection circuit according to the first embodiment.

DETAILED DESCRIPTION

Embodiments provide a non-volatile semiconductor memory device with low power consumption.

In general, according to one embodiment, a non-volatile semiconductor memory device includes a memory array including a plurality of memory cell transistors electrically connected between bit lines and source lines, wherein the memory array is partitioned into a plurality of memory blocks, and a source line driver configured to set a voltage level of the source lines to a reference voltage level. A first wiring is electrically connected to a first monitoring position of the source lines. A second wiring is electrically connected to a second monitoring position of the source lines different from the first monitoring position, which is provided on the plurality of third source lines. A selection circuit selects between the first monitoring position and the second monitoring position. A source line voltage control circuit is configured to compare a source line voltage of a selected monitoring position, and output the result to the source line driver.

Hereinafter, description will be given with regard to embodiments of the present disclosure with reference to the drawings.

First Embodiment

Figure 1:
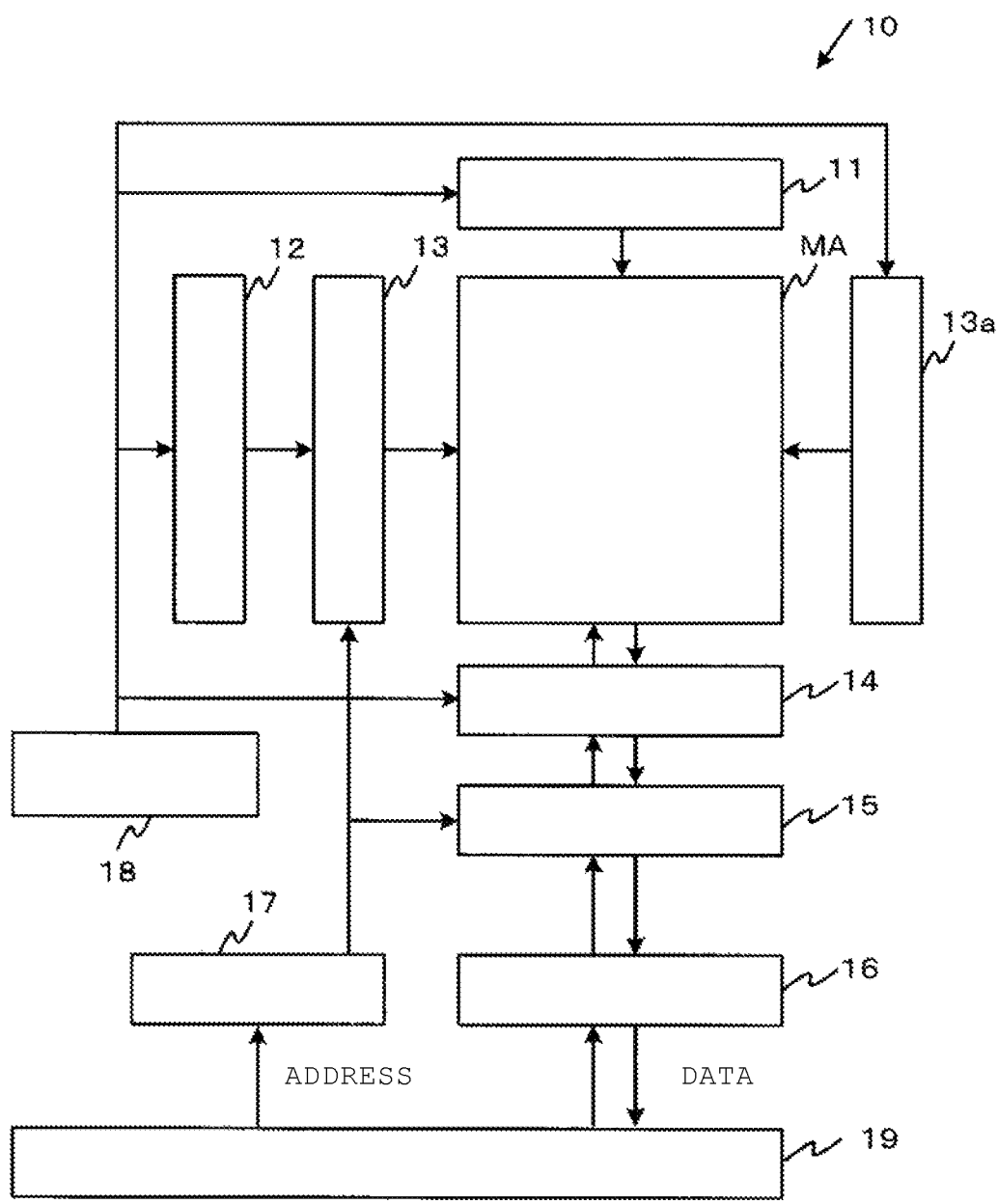
FIG. 1 is a block diagram showing a non-volatile semiconductor memory device according to a first embodiment.
Figure 2:
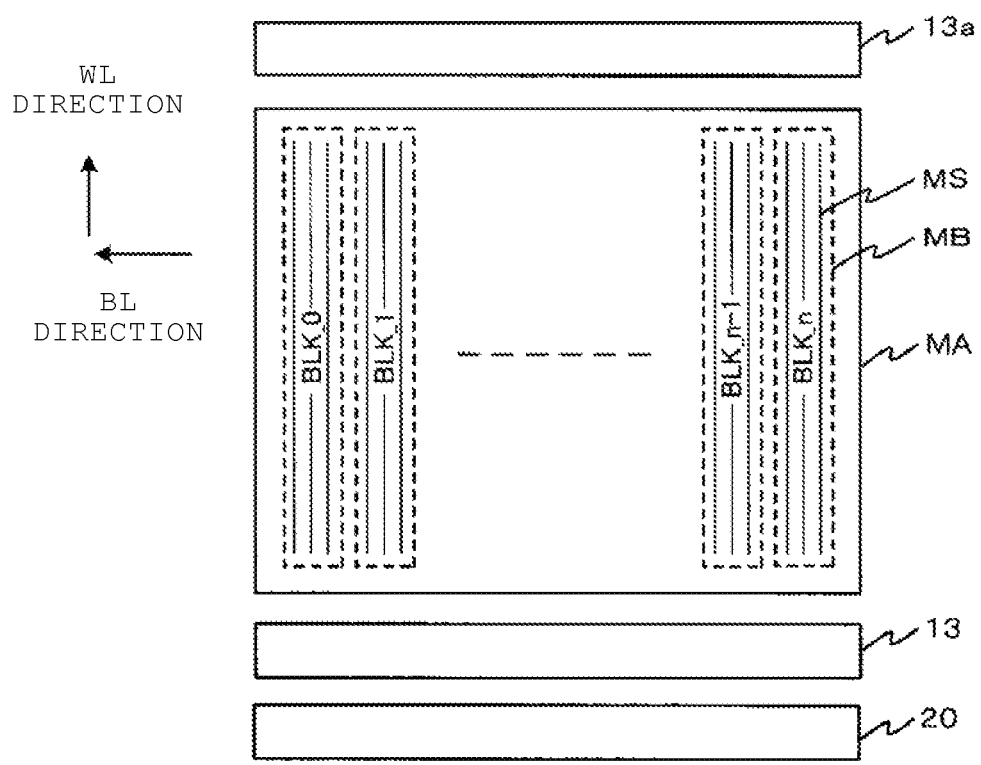
FIG. 2 is a block diagram which shows a peripheral circuit including a memory cell array according to the first embodiment.
Figure 3:
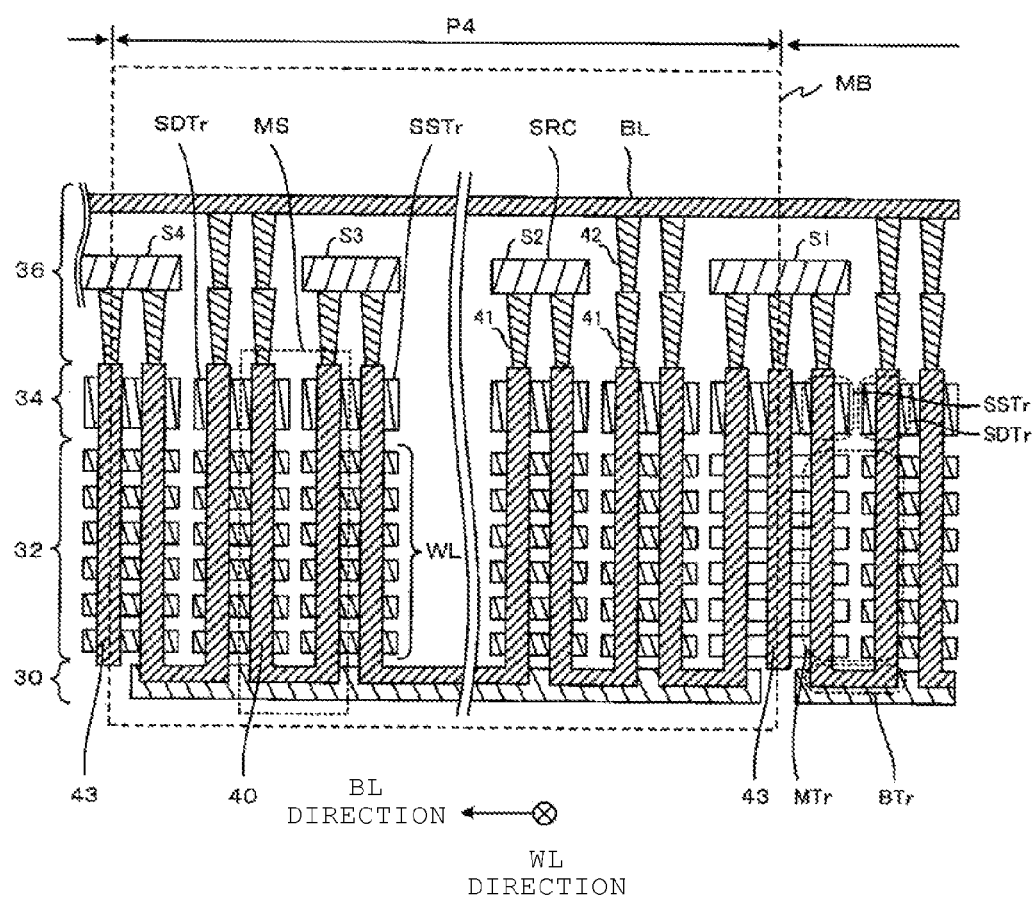
FIG. 3 is a cross-sectional diagram showing the memory cell array according to the first embodiment.

Description will be given with regard to a non-volatile semiconductor memory device of the present embodiment with reference to FIGS. 1 to 8. FIG. 1 is a block diagram showing a non-volatile semiconductor memory device according to a first embodiment. FIG. 2 is a block diagram showing a memory cell array of the non-volatile semiconductor memory device. FIG. 3 is a cross-sectional diagram showing the memory cell array according to the first embodiment.

Figure 4:
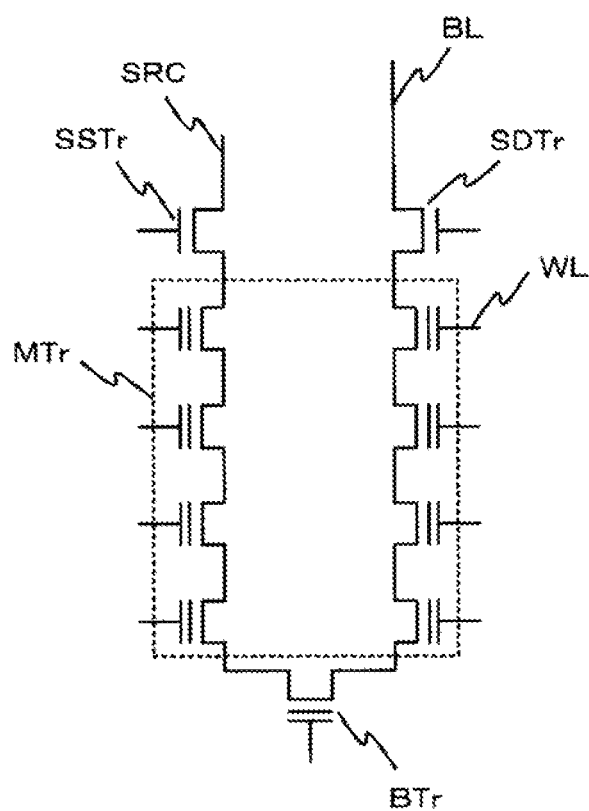
FIG. 4 is a diagram showing an equivalent circuit of main parts of the memory cell array according to the first embodiment.
Figure 5:
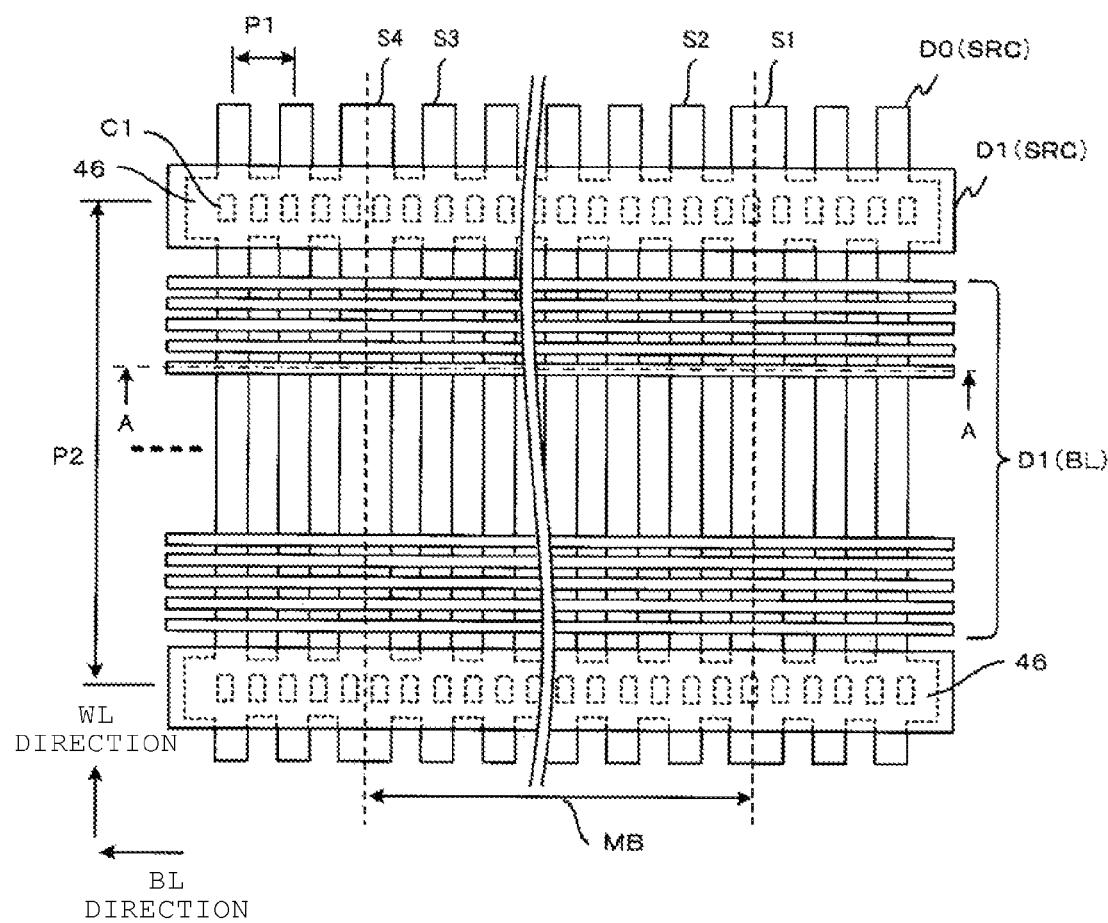
FIG. 5 is a plan diagram showing a first or a second wiring layer of the memory cell array according to the first embodiment.
Figure 6:
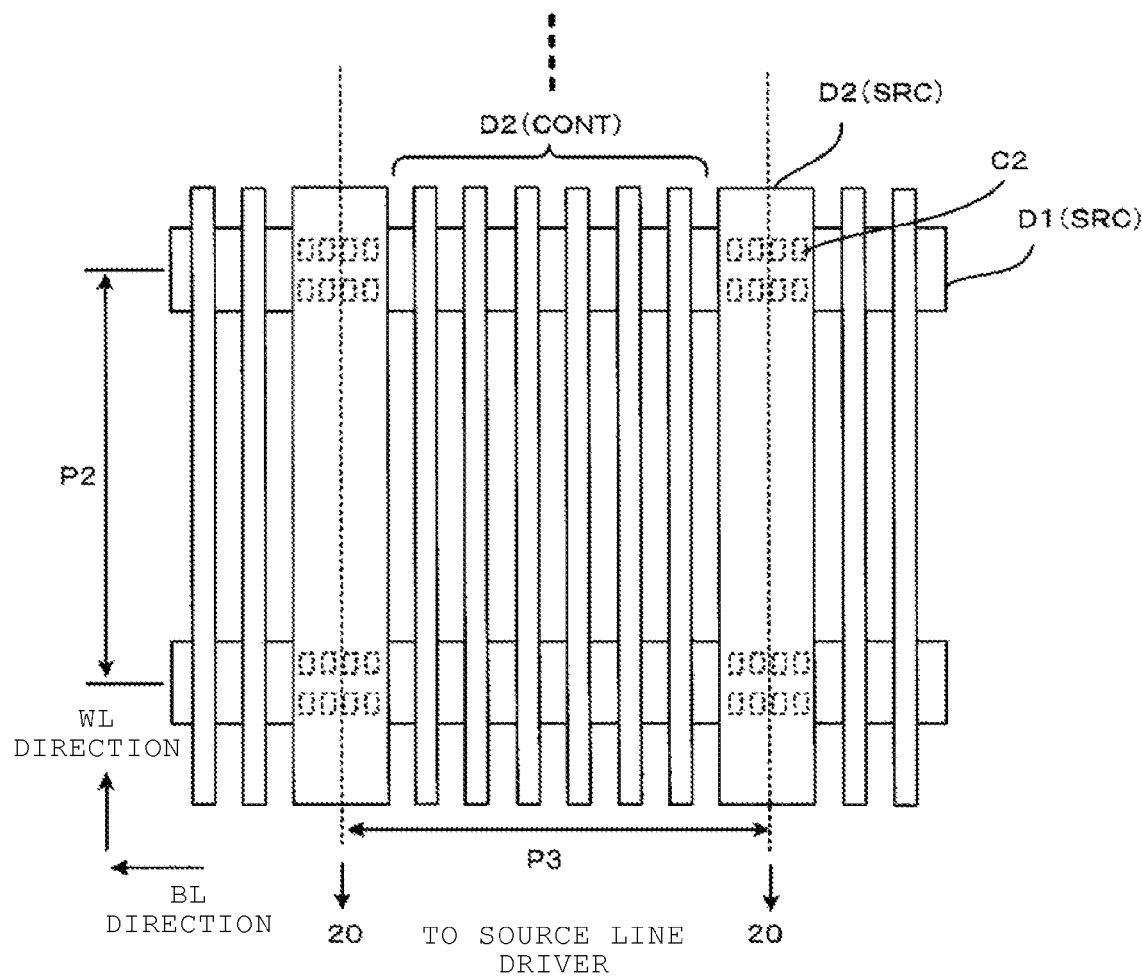
FIG. 6 is a plan diagram showing a second or a third wiring layer of the memory cell array according to the first embodiment.

FIG. 4 is a diagram showing an equivalent circuit of memory string of the memory cell array. FIG. 5 is a plan diagram showing a first or a second wiring layer of the memory cell array, and FIG. 6 is a plan diagram showing a second or a third wiring layer of the memory cell array.

Figure 9:
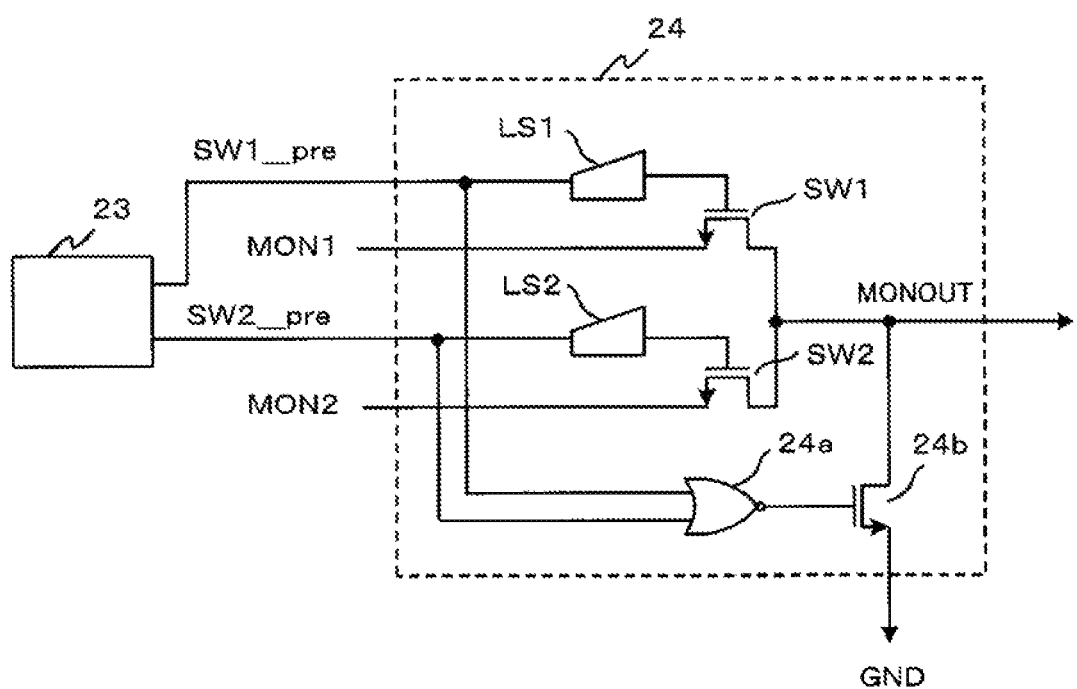
FIG. 9 is a diagram showing a switch circuit of the source line monitoring position selection circuit according to the first embodiment.
Figure 10:
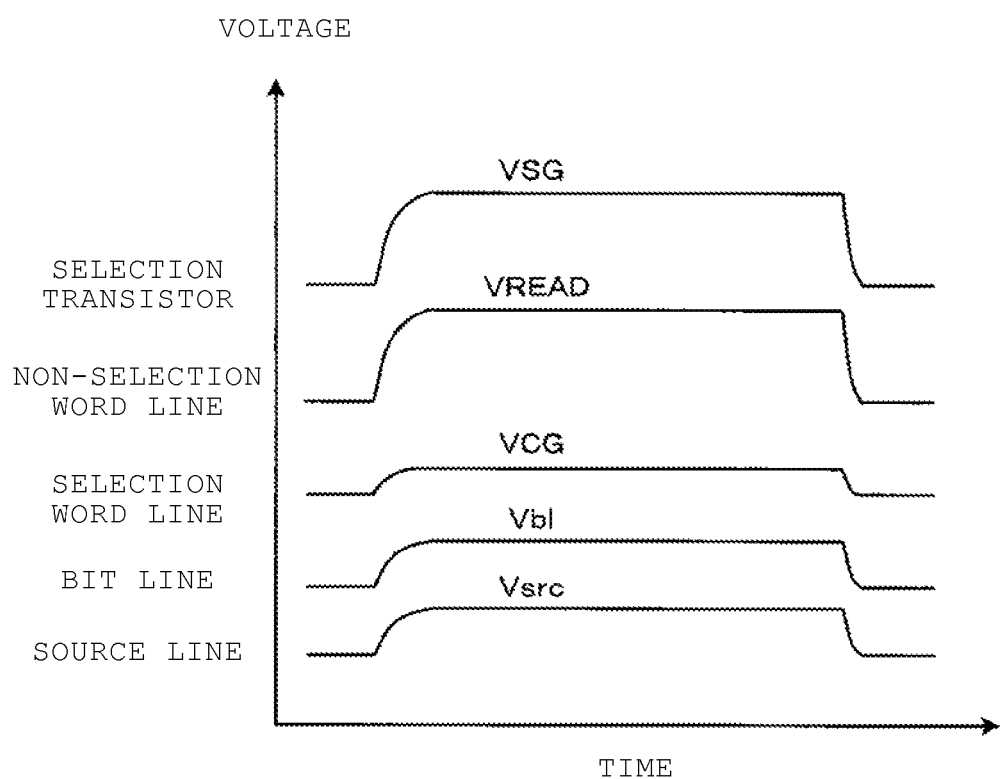
FIG. 10 is a timing chart showing a reading operation of the non-volatile semiconductor memory device according to the first embodiment.

FIG. 7 is a diagram showing a source line control circuit of the non-volatile semiconductor memory device, FIG. 8 is a diagram showing an operation of a decode circuit of a source line monitoring position selection circuit, and FIG. 9 is a diagram showing a switch circuit of the source line monitoring position selection circuit. FIG. 10 is a timing chart showing a reading operation of the non-volatile semiconductor memory device.

The non-volatile semiconductor memory device of the present embodiment is a stacked NAND flash memory in which a memory cell including a vertical transistor is three-dimensionally disposed. Reading of data is performed by applying a difference between a bit line voltage and a source line voltage to a memory cell which is selected and detecting a cell current which flows into the selected memory cell.

If the current is detected using a negative sense during reading or verify reading of the data, voltage distribution due to a wiring resistance of the source line in response to a physical position of the selected memory cell occurs in the source line.

The non-volatile semiconductor memory device of the present embodiment decreases a memory cell position dependence of the source line voltage by controlling the source line voltage in response to the physical position of the selected memory cell.

As shown in FIG. 1, a non-volatile semiconductor memory device 10 of the present embodiment includes a memory cell array MA for storing the data, a source line control circuit 11, a word line driver 12, row decoders 13 and 13a for specifying the memory cell which performs various operations (reading operation, writing operation, and erasing operation), a sense amplifier 14, a data latch 15, and a data input and output buffer 16 for reading or writing the data.

The non-volatile semiconductor memory device 10 further includes an address buffer 17 and a voltage generation circuit 18. The address buffer 17 receives address signals which specify the memory cell and outputs the address signals to the row decoder 13 and the data latch 15. The voltage generation circuit 18 generates a voltage which is necessary for reading, writing, and erasing and supplies the generated voltage to the source line control circuit 11, the word line driver 12, the row decoders 13 and 13a, and the sense amplifier 14.

The source line control circuit 11 includes a source line driver, a plurality of monitor wirings for monitoring the voltage of the source line, the source line monitoring position selection circuit, and the source line voltage control circuit.

The source line monitoring position selection circuit selects any one of the plurality of monitor wirings in response to control signals. The source line voltage control circuit operates so that the voltage of the source line in the source line monitoring position is equal to a reference voltage. The source line control circuit 11 will be described in detail later.

The non-volatile semiconductor memory device 10 includes an external controller (memory controller or host) 19 for controlling the reading of the data from the memory cell array MA and the writing of the data to the memory cell array MA. The external controller 19 supplies address data or command data to input and output ports of the address buffer 17 and the data input and output buffer 16.

In addition, the external controller 19 includes a portion of the source line control circuit according to the present embodiment (for example, decode circuit included in the above-described source line monitoring position selection circuit) and it may be possible to select whether or not to perform the operation of the source line control circuit according to the embodiment.

As shown in FIG. 2, the memory cell array MA includes a plurality of memory blocks MB. The plurality of memory blocks MB extend along a word line WL direction and are arrayed in a bit line BL direction. The memory block MB includes a plurality of memory strings MS. The configurations of the memory block MB and the memory string MS will be described later.

The row decoders 13 and 13a are disposed on both sides of the memory cell array MA. The source line driver 20 is disposed on the same side as the row decoder 13. A sense amplifier 14 (not shown) is disposed on the bottom of memory cell array MA so as to increase the memory cell density of the memory cell array MA. A source line driver 20 will be described later.

FIG. 3 is a cross-sectional diagram in which the memory cell array MA which is obtained by stacking six conductive layers WL is cut along the bit line BL direction. As shown in FIG. 3, the memory cell array MA includes a back gate layer 30, a memory layer 32, a selection transistor layer 34, and a wiring layer 36.

A U-shaped columnar semiconductor layer 40 is provided on the memory cell array MA. The columnar semiconductor layer 40 functions as a memory transistor which configures a back gate transistor and a memory cell which will be described later and a channel (body) of a selection transistor.

A gate insulating film (not shown) and a gate electrode (not shown) are provided around the columnar semiconductor layer 40 which touches a U-shaped bottom portion in the back gate layer 30. A back gate transistor BTr is configured to include the columnar semiconductor layer 40, the gate insulating film, and the gate electrode.

A metal nitride oxide semiconductor (MNOS) layer is provided around the columnar semiconductor layer 40 which touches the U-shaped side portion in a memory layer 32 as a charge storage layer (not shown). The stacked conductive layer WL which serves as the gate electrode is provided around the columnar semiconductor layer 40 across the MNOS layer. A plurality of memory transistors MTr which are connected in series are configured to include the columnar semiconductor layer 40, the MNOS layer, and the stacked conductive layer WL. The stacked conductive layer WL is also a word line WL.

A threshold voltage of the memory transistor MTr is different depending on whether or not electrons are trapped in the MNOS layer. Threshold voltage states which are different from each other indicate a storage state of 0/1.

The gate insulating film (not shown) and the gate electrode (not shown) are provided around the columnar semiconductor layer 40 which touches a U-shaped upper end portion in the selection transistor layer 34. Selection transistors SSTr and SDTr are configured to include the columnar semiconductor layer 40, the gate insulating film, and the gate electrode.

The back gate transistor BTr, the plurality of memory transistors MTr, and the selection transistors SSTr and SDTr are connected in series to configure the memory string MS.

A bit line BL is connected to one end of the memory string MS through contact plugs 41 and 42 in the wiring layer 36. A source line SRC is connected to the other end of the memory string MS through the contact plug 41.

A memory string MS which is adjacent is connected to the same source line SRC. A linear columnar semiconductor layer 43 is provided between the memory strings MS which are connected to the same source line SRC at regular intervals (P4). The columnar semiconductor layer 43 is a dummy columnar semiconductor layer. On one end of the columnar semiconductor layer 43 is connected to the source line SRC and the other end of the columnar semiconductor layer is open.

The memory block MB is configured to include the plurality of the memory strings MS which are disposed between the dummy columnar semiconductor layers 43.

Since the NAND flash memory is configured to share the source line with a large number of memory cells, writing is performed in units of "page" which is configured to include a plurality of memory cells, and erasing is performed in units of "block" which is configured to include a plurality of pages. Moreover, the unit of the erasing is not limited to the block unit, for example, the erasing may be performed for each group of a plurality of groups into which the block is divided.

When the data is read or written, the memory block MB in the block address is selected and reading or writing of the data is performed in units of page within the selected memory block MB. Erasing of the data is performed, for example, in units of memory block MB.

Each page is controlled by a word line. The page is a group of the memory transistors MTr which are connected to the same word line WL in the memory block MB. Moreover, the page is not limited to the above-described definition, for example, the page may be configured to include a portion of the memory cell transistor MTr which are connected to the word line WL in common.

However, there is a case where a dummy cell transistor is inserted because of various reasons. In this case, the dummy cell transistor is excluded from the count of the number of pages.

FIG. 4 is a diagram showing an equivalent circuit of the memory string MS. As shown in FIG. 4, a series circuit in which the plurality of the memory transistors MTr are respectively connected in series to both sides of the back gate transistor BTr is configured.

The selection transistor SDTr is connected to one end of the series circuit and the selection transistor SSTr is connected to the other end of the series circuit. The selection transistor SDTr is connected to the bit line BL and the selection transistor SSTr is connected to the source line SRC.

FIGS. 5 and 6 are plan diagrams showing the wiring layer 36 on the memory cell array MA. The wiring layer 36 is provided with at least first to third wiring layers D0, D1, and D2 on the memory cell array MA. The first wiring layer D0 on the memory cell array MA and the second wiring layer D1 which is provided above the first wiring layer D0 are shown in FIG. 5. The second wiring layer D1 and the third wiring layer D2 which are provided above the second wiring layer D1 are shown in FIG. 6.

As shown in FIG. 5, a plurality of source lines (first source line) D0 (SRC) which extend in the word line WL direction are arrayed with a first pitch P1 in the first wiring layer D0. The source line D0 (SRC) is the source line SRC which is shown in FIG. 3. A plurality of bit lines D1 (BL) and the plurality of source lines (second source line) D1 (SRC) which extend to the same direction as the bit line D1 (BL) are provided on the second wiring layer D1. The bit line D1 (BL) is the bit line BL which is shown in FIG. 3.

The plurality of source lines D1 (SRC) are arrayed in the word line WL direction with a second pitch P2. The second pitch P2, for example, is the 512 bit line D1 (BL).

The plurality of the source lines D0 (SRC) are connected in common to a region called a shunt 46. The shunt 46 is provided at an intersection of the plurality of the source lines D0 (SRC) and the plurality of the source lines D1 (SRC). The plurality of the source lines D0 (SRC) are electrically connected to the source line D1 (SRC) of the second wiring layer D1 through a first contact C1 in the shunt 46.

A cross-sectional diagram in which the memory cell array MA is cut along the A-A line and is viewed from the direction of the arrows is the cross-sectional diagram shown in FIG. 3. Source lines S1, S2, S3, and S4 to which reference numerals are individually affixed are the same source lines in FIGS. 3 and 5.

As shown in FIG. 6, the plurality of source lines (third source line) D2 (SRC) which extend to the word line WL direction and the wiring D2 (CONT) are provided on the third wiring layer D2. The plurality of source lines D2 (SRC) are arrayed in the bit line BL direction with a third pitch P3. The third pitch P3, for example, is a 12 source line D0 (SRC). The wiring D2 (CONT) is provided between the source lines D2 (SRC). The wiring D2 (CONT) includes a plurality of thin wirings.

The source line D2 (SRC) is a top metal having wiring resistance smaller than that of the source line D1 (SRC). The source line D2 (SRC) is electrically connected to the source line D1 (SRC) through a second contact C2. One end of each source line D2 (SRC) is connected to the source line driver 20 which is shown in FIG. 2.

The wiring D2 (CONT) is used as a signal line such as of the row decoders 13 and 13a, the sense amplifier 14, and the data latch 15. The wiring D2 (CONT) is laid out in a linear manner.

FIG. 7 is a view showing the source line control circuit 11. As shown in FIG. 7, the source line control circuit 11 includes the source line driver 20, monitor wirings (first wiring, second wiring) MON1, MON2 for monitoring the voltage of the source line, the source line monitoring position selection circuit (selection circuit) 21, and a source line voltage control circuit 22.

The monitor wiring MON1 and the source line D2 (SRC) are connected at a connection node (first monitoring position) N1. The monitor wiring MON2 and the source line D2 (SRC) are connected at a connection node (second monitoring position) N2. The source line monitoring position selection circuit 21 includes the decode circuit 23 and the switch circuit 24.

In the present disclosure, when a plane disposition of the memory block MB in the memory cell array MA shown in FIG. 2 is referenced, the memory cell array MA is referred to as a memory plane MP. In addition, when the entire memory block is referred to, the entire memory block is referred to as the memory block MB and individual memory block is referred to as a memory block BLK_0 . . . BLK_n.

The memory plane MP includes (n+1) memory blocks BLK_0 to BLK_n. The memory plane MP is divided into regions of a first region MP1, and a second region MP2. Memory blocks BLK_0 to BLK_k are disposed in the first region MP1, and memory blocks BLK_k+1 to BLK_n are disposed in the second region MP2.

For simplicity, n is set to an odd number. In order to equalize the number of memory blocks MB which are included in the first region MP1, and in the second region MP2, k=(n−1)/2.

Source lines D2 (SRC) are respectively extracted from each memory block MB. The extracted source lines D2 (SRC) are respectively connected to an n-type MOS transistor STr of the source line driver 20.

The monitor wiring MON1 is connected to the middle of memory blocks BLK_0 and BLK_k, which are disposed at both ends, and to the inside the source line D2 (SRC) in the first region MP1, that is, to the source line D2 (SRC) which is extracted from a memory block BLK_k/2 from one end of the memory plane MP which is in the position of ¼ of the memory plane MP.

In the same manner, the monitor wiring MON2 is connected to the middle of memory blocks BLK_k+1 and BLK_n, which are disposed at both ends, and to the inside the source line D2 (SRC) in the second region MP2, that is, to the source line D2 (SRC) which is extracted from a memory block BLK_(n+k+1)/2 from the other end of the memory plane MP which is in the position of ¼ of the memory plane MP.

The decode circuit 23 decodes control signals Sc which specifies the memory block MB to be selected and outputs decode results SW1_pre and SW2_pre which show whether the selected memory block MB is in the first region MP1, or in the second region MP2.

A selection signal includes the address of the memory string MS which is selected to read the data or the address of the memory block MB to which the memory string MS to be selected belongs.

FIG. 8 is a diagram showing a decode result of the decode circuit 23. As shown in FIG. 8, when the selected memory block MB is any one of the memory blocks BLK_0 to BLK_k in the first region MP1, the decode result SW1_pre is set to a high level and the decode result SW2_pre is set to a low level.

When the selected memory block MB is any one of the memory blocks BLK_k+1 to BLK_n in the second region MP2, the decode result SW1_pre is set to the low level and the decode result SW2_pre is set to the high level.

When the selected memory block MB is neither in the first region MP1, nor in the second region MP2, both of the decode results SW1_pre and SW2_pr are set to the low level.

FIG. 9 is a circuit diagram showing the switch circuit 24. As shown in FIG. 9, the switch circuit 24 includes two switch elements SW1 and SW2. Both of the switch elements SW1 and SW2 are n-type MOS transistors. The source electrode is connected to the monitor wiring MON1 and the decode result SW1_pre is input to the gate electrode through a level shift circuit LS1 in the switch element SW1.

The source electrode is connected to the monitor wiring MON2 and the decode result SW2_pre is input to the gate electrode through a level shift circuit LS in the switch element SW2. Two drain electrodes are connected to each other. The level shift circuits LS1 and LS2 are used to respectively match the voltage levels of the decode results SW1_pre and SW2_pre with operation level of the n-type MOS transistors.

The switch circuit 24 operates as follows. When the decode result SW1_pre is at a high level, the switch element SW1 is turned on and the switch element SW2 is turned off. When the decode result SW2_pre is at a high level, the switch element SW1 is turned off, and the switch element SW2 is turned on.

When the switch element SW1 is turned on, the source line voltage in the connection node N1 is output from an output terminal MONOUT. On the other hand, the switch element SW2 is turned on, the source line voltage in the connection node N2 is output from the output terminal MONOUT.

That is, if any one of the memory blocks BLK_0 to BLK_k is selected, the monitor wiring MON1 is connected to a non-inversion input terminal of the source line voltage control circuit 22. If any one of the memory blocks BLK_k+1 to BLK_n is selected, the monitor wiring MON2 is connected to the non-inversion input terminal of the source line voltage control circuit 22.

The switch circuit 24 further includes a NOR circuit 24a and an n-type MOS transistor 24b. Two input terminals of the NOR circuit 24a are respectively connected to the monitor wirings MON1 and MON2. The n-type MOS transistor 24b is connected between the output terminal MONOUT and a ground terminal GND. The gate electrode of the n-type MOS transistor 24b are connected to an output terminal of the NOR circuit 24a.

When both of the decode results SW1_pre and SW2_pre are at low levels, the n-type MOS transistor 24b is turned on. The switch circuit 24 is reset and the switch elements SW1 and SW2 are tuned off.

The source line voltage control circuit 22 is a differential circuit, for example, an operational amplifier. A non-inversion input terminal of the operational amplifier is connected to the source line monitoring position selection circuit 21, an inversion input terminal is connected to a power supply (not shown) which outputs a reference voltage Vref, and an output terminal is connected to the gate electrode of the transistor STr of the source line driver 20.

The source line voltage control circuit 22 responds to the decode results SW1_pre and SW2_pre of the decode circuit 23 and operates so that a source line voltage Vsrc in the connection node N1 or the connection node N2 is equal to the reference voltage Vref. The connection nodes N1 and N2 are also referred to as the source line monitoring positions N1 and N2.

The voltage Vsrc of the source line D2 (SRC) in the source line monitoring position N1 or the source line monitoring position N2 is equal to the reference voltage Vref.

The source line monitoring positions N1 and N2 are provided between the source line driver 20 and the memory plane MP. On the other hand, the monitor wirings MON1 and MON2, for example, are provided on the second wiring layer D1 of the wiring layer 36 together with the source line D2 (SRC).

FIG. 10 is a timing chart showing the operation of reading the data. As shown in FIG. 10, the reading operation of the memory cell applies a reading voltage VCG to the selected word line WL and applies a reading non-selection voltage VREAD which is higher than the reading voltage VCG to the non-selection word line WL.

The voltage VSG which is higher than the threshold voltage is applied to the gate electrode of the selection transistors SDTr and SSTr. The selection transistors SDTr and SSTr are placed in a turned-on state and the memory string MS conducts with the source line SRC and the bit line BL.

As a result, a difference ($\Delta V = Vbl - Vsrc$) between a voltage Vbl of the bit line BL and the voltage Vsrc of the source line SRC is applied between the memory strings MS. At this time, the current flows toward the source line from the bit line in the selected memory string MS within the selected memory block MB. The reading of the data is performed depending on whether or not the current flows through the selected memory string MS.

Next, description will be given with regard to the effect of the source line control circuit 11 of the present embodiment in contrast with a source line control circuit of a comparative example.

Figure 11:
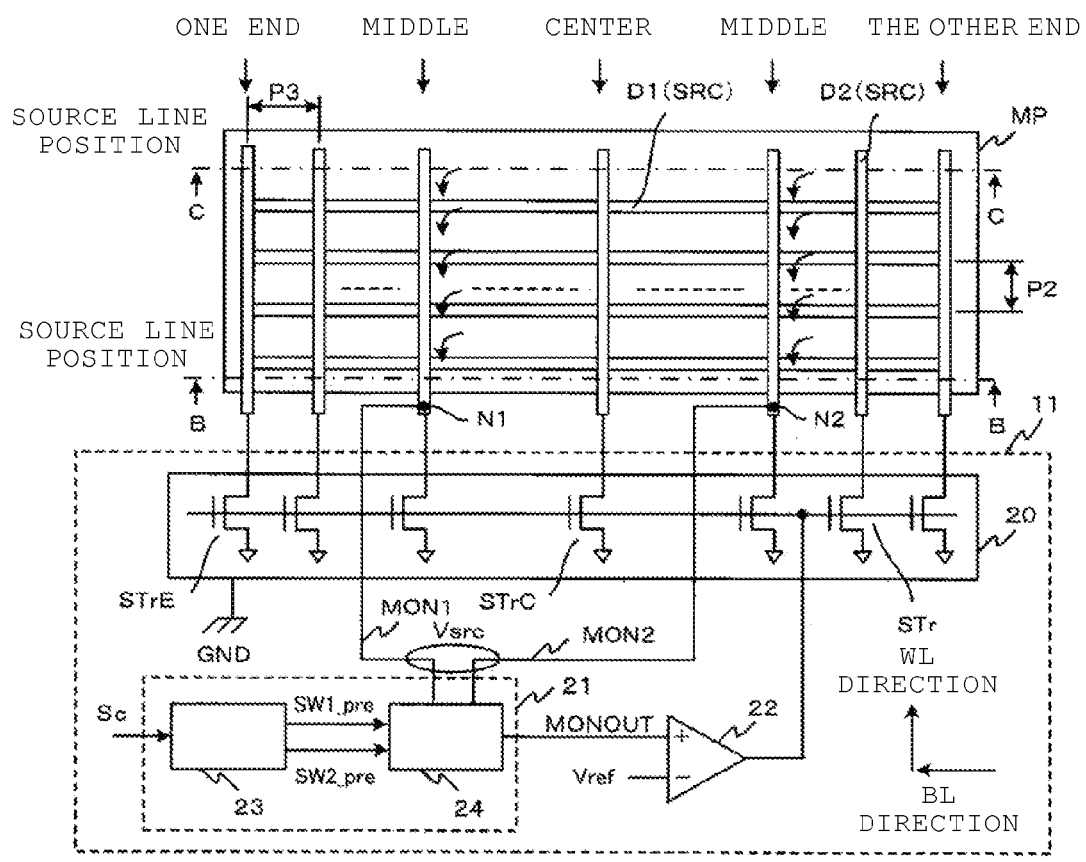
FIG. 11 is a diagram showing a relationship between a source line and the source line control circuit according to the first embodiment.
Figure 12:
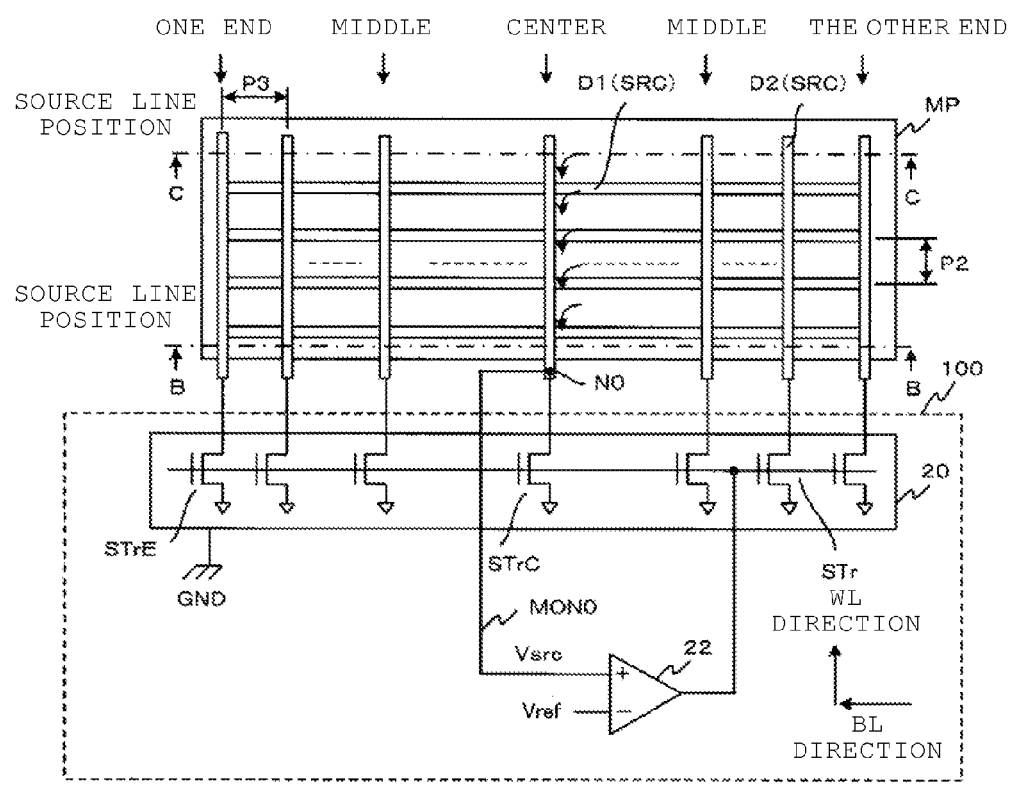
FIG. 12 is a diagram showing a relationship between a source line of a comparative example and the source line control circuit according to the first embodiment.

FIG. 11 is a diagram showing the source line control circuit 11 by paying attention to a connection relation of the source line D1 (SRC) and the source line D2 (SRC). FIG. 12 is a diagram showing the source line control circuit of the comparative example by focusing on a connection relation of the source line D1 (SRC) and the source line D2 (SRC).

First, a description will be given with regard to the source line control circuit of the comparative example. As shown in FIG. 12, a source line control circuit 100 of the comparative example includes the source line driver 20 and the source line voltage control circuit 22 in the same manner as the source line control circuit 11 of the present embodiment.

The difference is that the source line control circuit 100 includes only one monitor wiring MON0 which is connected to the source line D2 (SRC) positioned at the center through a connection node N0, whereas the source line control circuit 11 is dispersed and includes the two monitor wirings MON1 and MON2 which are connected to the source line D2 (SRC) and the source line monitoring position selection circuit 21. The node N0 is also referred to as a source line monitoring position N0.

The source line voltage control circuit 22 operates in the source line control circuit 100 of the comparative example so that the voltage Vsrc of the source line is equal to the reference voltage Vref in the source line monitoring position N0 at the center.

Incidentally, if the threshold voltage of the memory transistor MTr is written in negative regions, or if the threshold voltages of the selection transistors SDTr and SSTr are negative, a method of reading that is performed by applying a positive voltage to the source line SRC during reading is frequently adopted.

For example, it is possible to read a negative threshold voltage since a gate to source voltage Vgs of the selected memory transistor MTr becomes negative if the reading voltage VCG to be applied to the gate electrode (that is, the selected word line WL) of the selected memory transistor MTr is lower than a positive voltage, for example, in a state where the positive voltage is applied to the source line SRC.

In addition, if the threshold voltages of the selection transistors SDTr and SSTr are negative, the cell current which is not intended also flows through non-selection memory string MS. However, if the positive voltage is applied to the source line SRC, it is possible to make the gate to source voltage Vgs of the selection transistors SDTr and SSTr negative. As a result, the selection transistors SDTr and SSTr are cut off and it is possible to suppress the current from flowing through the non-selection memory string MS.

Accordingly, it is preferable that a potential of the source line SRC be a constant value all the time regardless of the position of the selected memory block MB.

However, in the source line control circuit 100 of the comparative example, it is difficult to keep the voltage of the source line D2 (SRC) within a predetermined range. Hereinafter, the reasons will be described.

The memory block MB is disposed in a direction perpendicular to the source line driver 20. The cell current flows so as to be diffused at the shunt 46 in a transverse direction through the source line D0 (SRC) of the first wiring layer D0 and the source line D1 (SRC) of the second wiring layer D1 on the memory cell array MA.

However, as described above, since the source line D2 (SRC) of the third wiring layer D2 on the memory cell array MA is the lowest resistance and the third wiring layer D2 is laid out in a linear manner, the cell current which flows into the source line D1 (SRC) is not dispersed in the transverse direction and a higher concentration current flows through the source line D2 (SRC) which is substantially directly above the selected memory block MB.

Figure 13:
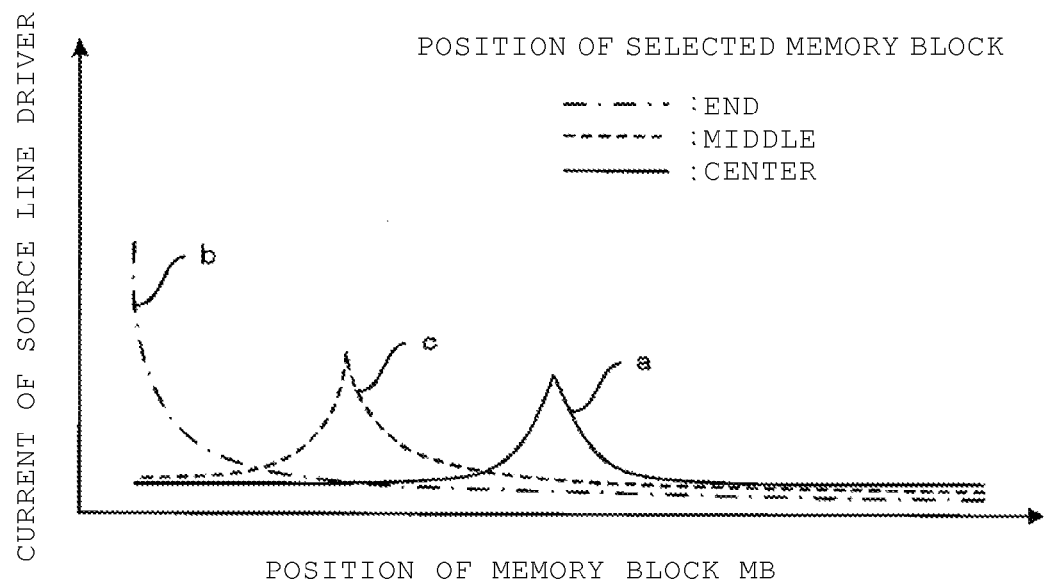
FIG. 13 is a diagram showing a current which flows into a source line driver of the source line control circuit according to the first embodiment.

FIG. 13 is a diagram showing a distribution of the current which flows into the source line driver 20. In FIG. 13, a horizontal axis shows the position of the memory block MB. A vertical axis shows the current which flows through each transistor STr of the source line driver 20. A variable parameter is the position of the selected memory block MB.

A current distribution a (solid line) shows the current which flows through each transistor STr when the memory block MB which is positioned at the center is selected. The current distribution b (dashed-dotted line) shows the current which flows through each transistor STr when the memory block MB which is positioned in the edge is selected. The current distribution c (dashed line) shows the current which flows through each transistor STr when the memory block MB which is positioned between the center and the edge is selected. Accordingly, integral values of the respective current distributions a, b, and c are total currents which flow into the source line driver 20.

As shown in FIG. 13, the distribution of the current which flows into the source line driver 20 is different depending on the position of the selected memory block MB. If the memory block MB which is positioned at the center of the memory plane MP is selected, the current which flows into the source line D0 (SRC) is dispersed in the transverse direction to some extent and flows so that the current which flows into the source line D2 (SRC) positioned at the center becomes largest (current distribution a).

If the memory block MB which is positioned at an end of the memory plane MP is selected, since the dispersion of the current is limited to one direction, substantially all the cell currents are concentrated on the transistor STr at the end of the source line driver 20 (current distribution b).

If the memory block MB which is positioned in the middle of the end and the center of the memory plane MP is selected, since the dispersion of the current is biased, the current distribution that is at about the middle of the current distribution a and the current distribution b is shown (current distribution c).

In the source line control circuit 11 of the present embodiment and the source line control circuit 100 of the comparative example, the distribution of the current which flows into the source line driver 20 is basically the same as shown in FIG. 13.

However, in the source line control circuit 100 of the comparative example, if the memory block MB which is positioned at the center of the memory plane MB is selected, the voltage Vsrc of the source line D2 (SRC) is equal to the reference voltage Vref in the closest place to the source line driver 20 of the memory block MB which is positioned at the center.

As being far from the source line driver 20, the voltage Vsrc of the source line D2 (SRC) becomes larger than the reference voltage Vref based on the cell current and the wiring resistance of the source line within the cell array MA.

If the memory block MB which is positioned at the end of the memory plane MP is selected, a higher concentration cell current flows through a transistor STrE of the source line driver 20 which is connected to the source line D2 (SRC) positioned at the end of the memory plane MP than the source line monitoring position N0, that is, a transistor STrC of the source line driver 20 which is connected to the source line D2 (SRC) positioned at the center.

However, since the gate electrodes of each transistor STr of the source line driver 20 are connected in common, any gate voltages Vgs of each transistor STr are equal. As a result, the drain-to-source voltage Vds of the transistor STrE which is connected to the source line D2 (SRC) positioned at the end of the memory plane MP becomes higher than the drain-to-source voltage Vds of the transistor STrC which is connected to the source line D2 (SRC) positioned at the center.

Figure 14:
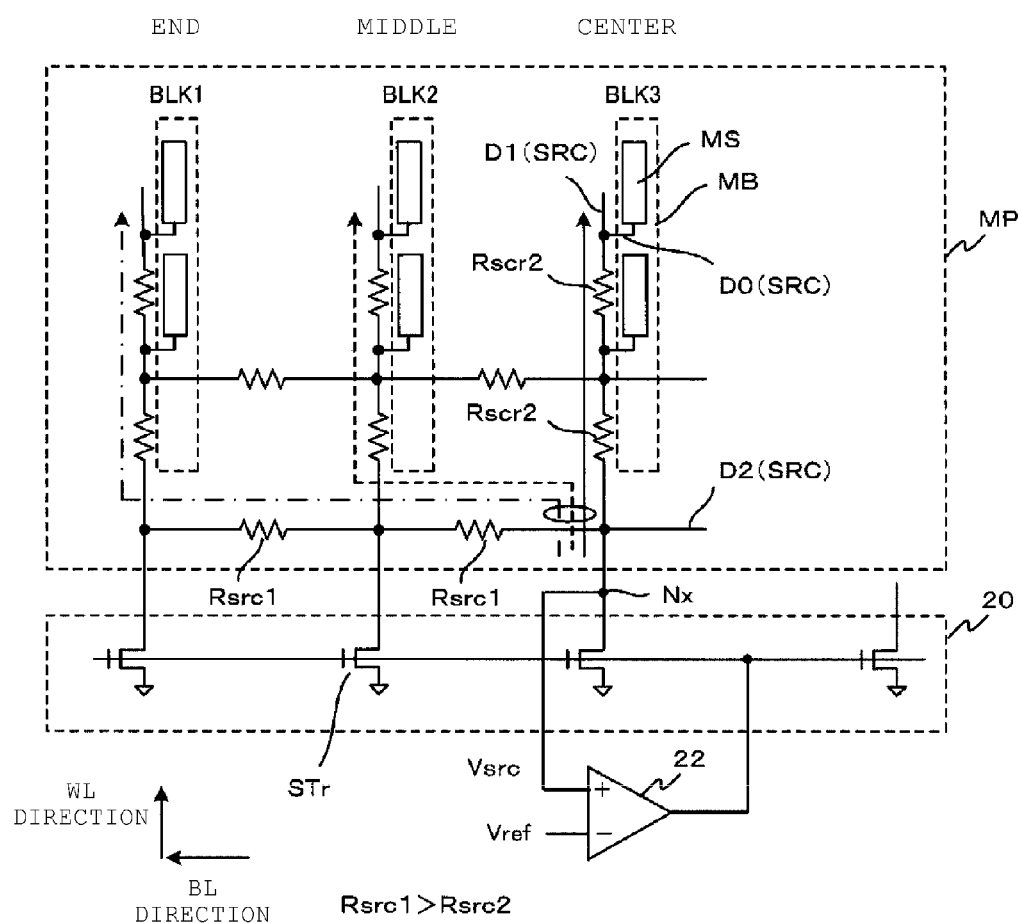
FIG. 14 is a diagram showing a relationship of the source line and a wiring resistance according to the first embodiment.

FIG. 14 is a diagram showing a relationship of the position of the selected memory block MB and the wiring resistance from the source line monitoring position Nx. As shown in FIG. 14, in a case of the source line, a wiring resistance Rsrc1 which is disposed in the bit line BL direction and a wiring resistance Rsrc2 which is disposed in the word line WL direction are electrically connected.

Here, the wiring resistance Rsrc1 is the wiring resistance of the source line D1 (SRC) and the wiring resistance Rsrc2 is the wiring resistance of the source line D2 (SRC). The wiring resistance Rsrc1 is larger than the wiring resistance Rsrc2. The voltage Vsrc of the source line in the source line monitoring position Nx is equal to the reference voltage Vref. The source line monitoring position Nx represents the source line monitoring position N0 of the comparative example or the source line monitoring position N1 of the present embodiment.

If the memory block BLK1 at the end of the memory plane MP is selected, since the memory block BLK1 is apart from the source line monitoring position Nx, the wiring resistance Rsrc1 in the bit line BL direction within the memory plane MP is not trivial. As a result, the source line voltage Vsrc becomes as high as the amount of a voltage drop by the source line wiring resistance Rsrc1.

Figure 15A:
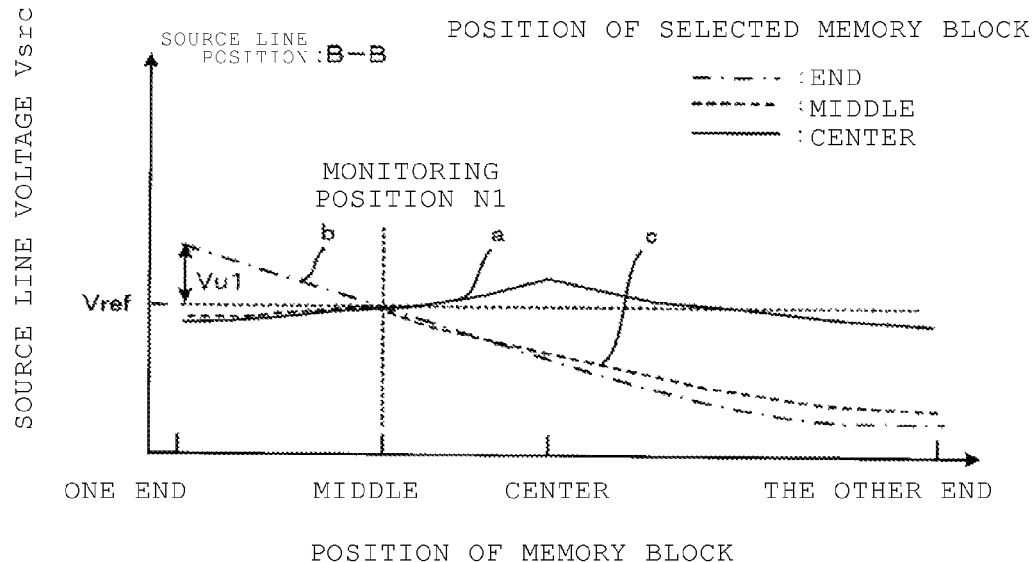
FIGS. 15A and 15B are diagrams showing voltage distribution of the source line according to the first embodiment in contrast with the comparative example.
Figure 15B:
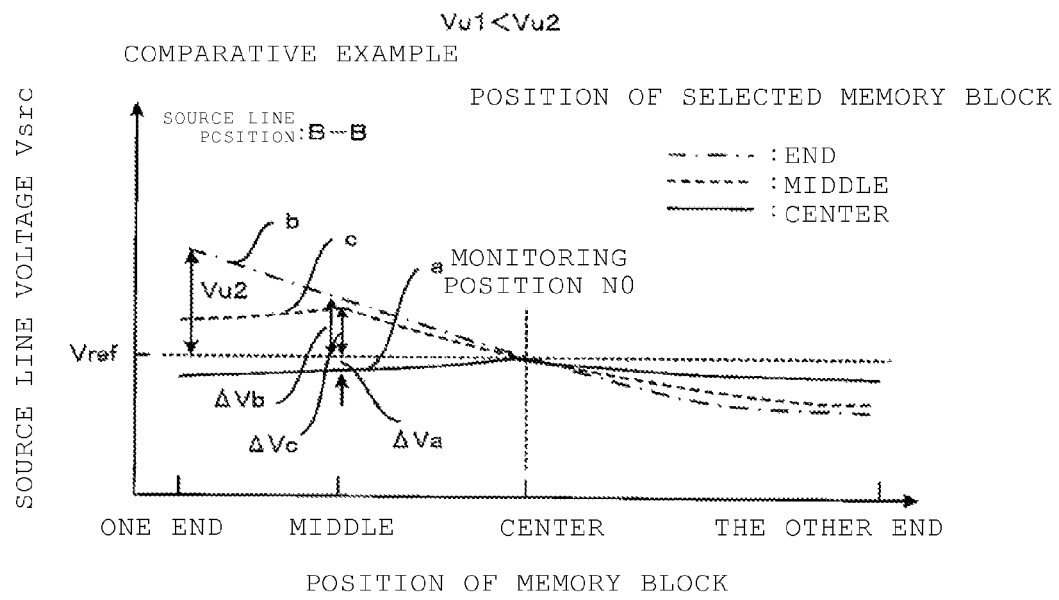

FIGS. 15A and 15B are diagrams showing the voltage distribution of the source line D2 (SRC) in a source line position B-B which is closest to the source line driver 20 in contrast with the comparative example, FIG. 15A is a diagram showing the voltage distribution of the source line D2 (SRC) of the present embodiment, and FIG. 15B is a diagram showing the voltage distribution of the source line D2 (SRC) of the comparative example.

Figure 16A:
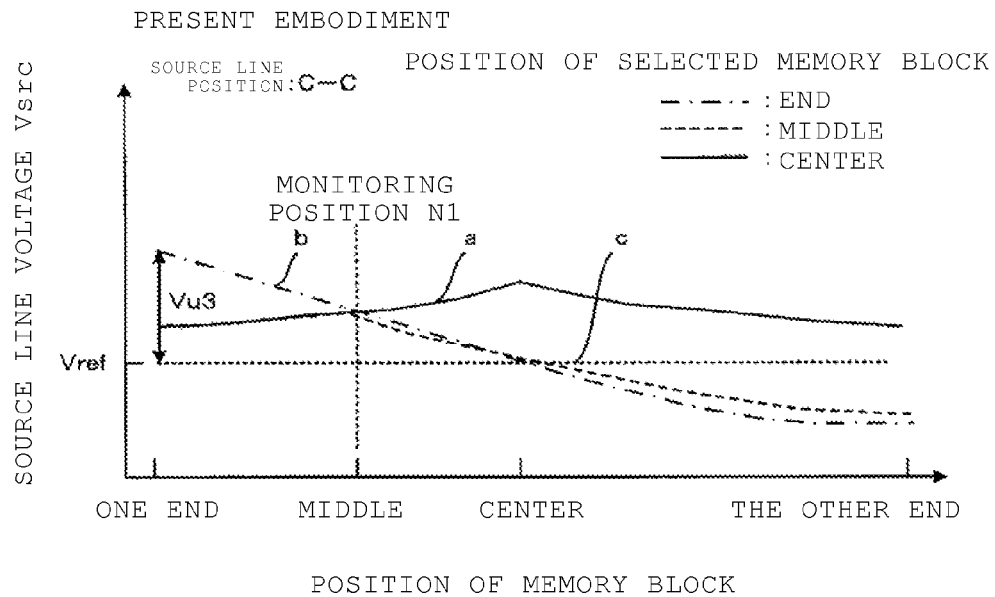
FIGS. 16A and 16B are diagrams showing the voltage distribution of the source line according to the first embodiment in contrast with the comparative example.
Figure 16B:
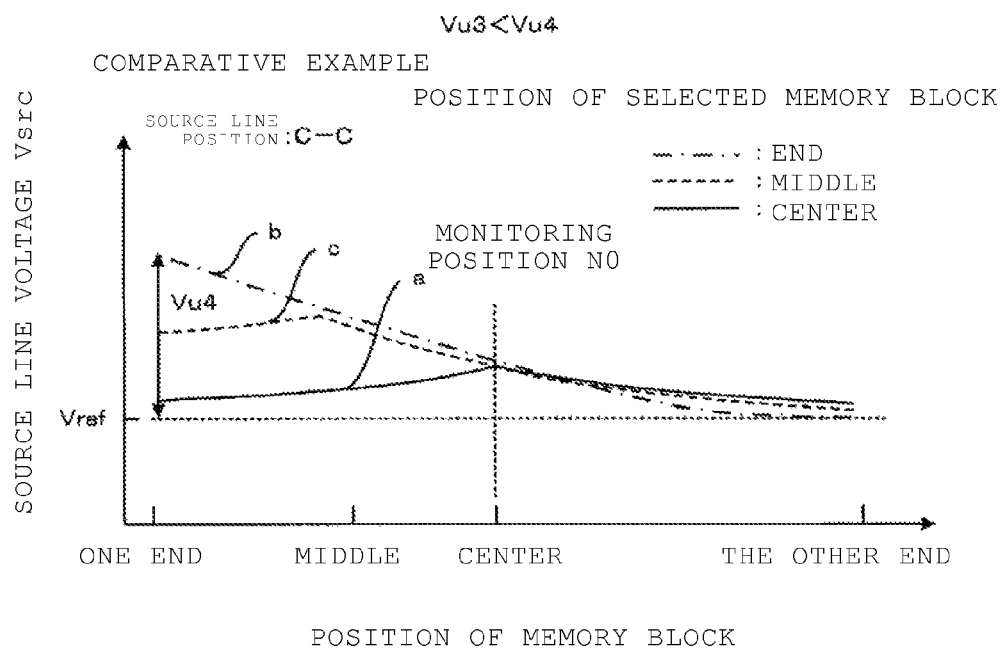

FIGS. 16A and 16B are diagrams showing the voltage distribution of the source line D2 (SRC) in a source line position C-C which is farthest from the source line driver 20 in contrast with the comparative example, FIG. 16A is a diagram showing the voltage distribution of the source line D2 (SRC) of the present embodiment, and FIG. 16B is a diagram showing the voltage distribution of the source line D2 (SRC) of the comparative example.

The horizontal axis represents the position of the memory block MB in FIGS. 15A and 15B and 16A and 16B. The vertical axis represents the voltage Vsrc of the source line D2 (SRC). The parameter is the position of the selected memory block MB.

In FIGS. 15A and 15B and 16A and 16B, the voltage distribution a (solid line) represents the voltage distribution of the source line D2 (SRC) when the memory block MB which is positioned at the center is selected. The voltage distribution b (dashed-dotted line) represents the voltage distribution of the source line D2 (SRC) when the memory block MB which is positioned at the end is selected. The voltage distribution c (dashed line) represents the voltage distribution of the source line D2 (SRC) when the memory block MB which is positioned in the middle of the end and the center is selected.

First, description will be given with regard to the comparative example. As shown in FIG. 15B, in the comparative example, the voltage Vsrc of the source line D2 (SRC) in the source line position B-B is equal to the reference voltage Vref in the source line monitoring position N0.

The voltage distribution a of the source line when the memory block BLK_k at the center is selected shows a peak at the center by following the current distribution a which is shown in FIG. 13 and shows a curve which is decreased toward both ends. The curve thereof is substantially symmetrical.

The voltage distribution b of the source line when the memory block BLK_0 at one end is selected shows a curve which is decreased toward the other end from the one end and is asymptotic to a constant value at the other end side by following the current distribution b which is shown in FIG. 13.

The voltage distribution c of the source line when the memory block BLK_k/2 in the middle is selected shows the peak in the middle by following the current distribution c which is shown in FIG. 13 and the curve which is close to the voltage distribution a at one end side and is close to the voltage distribution b at the other end side.

This shows that the wiring resistance increases as distance from the source line monitoring position N0 increases in the bit line BL direction and the voltage drop increases in response to the increase of the wiring resistance.

On the other hand, as shown in FIG. 15A, in the present embodiment, the voltage Vsrc of the source line D2 (SRC) in the source line position B-B is equal to the reference voltage Vref in the source line monitoring position N1.

Accordingly, the voltage distributions a, b, and c of the source line of the present embodiment show the distributions which basically respectively level-shifts the voltage distributions a, b, and c of the source line of the comparative example so that the source line voltage Vsrc in the source line monitoring position N1 becomes the reference voltage Vref.

Specifically, the voltage distribution a of the present embodiment is substantially equal to the distribution in which the voltage distribution a of the source line of the comparative example is leveled up by ΔVa. The voltage distribution b of the present embodiment is substantially equal to the distribution in which the voltage distribution b of the source line of the comparative example is leveled up by ΔVb. The voltage distribution c of the present embodiment is substantially equal to the distribution in which the voltage distribution c of the source line of the comparative example is leveled up by ΔVc.

ΔVa represents a difference between the source line voltage Vsrc of the voltage distribution a of the comparative example in the middle and the reference voltage Vref. The ΔVb represents a difference between the source line voltage Vsrc of the voltage distribution b of the comparative example in the middle and the reference voltage Vref. ΔVc represents a difference between the source line voltage Vsrc of the voltage distribution b of the comparative example in the middle and the reference voltage Vref.

A maximum value of a float Vu of the source line of the comparative example is a Vu2 when the memory block BLK_0 which is positioned at one end is selected. In contrast, the maximum value of a float Vu of the source line of the present embodiment is a Vu1 when the memory block BLK_0 which is positioned at one end is selected. The relation of the Vu1 and the Vu2 is the relation of Vu1=Vu2−ΔVb.

Here, the float Vu of the source line means the difference between the source line voltage Vsrc in the selected memory block MB and the reference voltage Vref, and is expressed by Vu=Vsrc−Vref.

Accordingly, in the present embodiment, since the maximum value of the float Vu of the source line is smaller than that of the comparative example, even if the memory block MB in which the float Vu of the source line is maximized is selected, it is possible to decrease the bit line voltage Vbl which is set so that the appropriate cell current flows into the memory block MB.

If the float Vu of the source line is smaller than the maximum value, it is possible to prevent unnecessary power from being consumed as the cell current which is larger than the appropriate cell current flows through the selected memory block.

In addition, as another effect of the present embodiment, since the maximum value of the float Vu of the source line becomes smaller than that of the comparative example, it is possible to achieve a reduction in chip size by narrowing a width of the shunt 46 by just that much and expanding the pitch of the shunt 46 and the like.

The voltage distribution of the source line D2 (SRC) in the source line position C-C which is farthest from the source line driver 20 shows a substantially similar tendency to the voltage distribution of the source line D2 (SRC) which is shown in FIGS. 15A and 15B.

As shown in FIG. 16B, the voltage distributions a, b, and c, which are in the source line position C-C, of the source line D2 (SRC) of the comparative example show the curves so that the voltage distributions a, b, and c shown in FIG. 15B are leveled up.

In the same manner, as shown in FIG. 16A, the voltage distributions a, b, and c, which are in the source line position C-C, of the source line D2 (SRC) of the present embodiment show the curves so that the voltage distributions a, b, and c shown in FIG. 15A are leveled up.

Since the wiring resistance increases as distance from the source line monitoring position increases in the word line WL direction, this shows that the voltage drop increases in response to the increase of the wiring resistance.

A maximum value Vu3 of the float Vu of the source line of the present embodiment is smaller than a maximum value Vu4 of the float Vu of the source line of the comparative example also in the source line position C-C (Vu3<Vu4).

An in-plane distribution of the source line voltage will be described in detail.

Figure 17A:
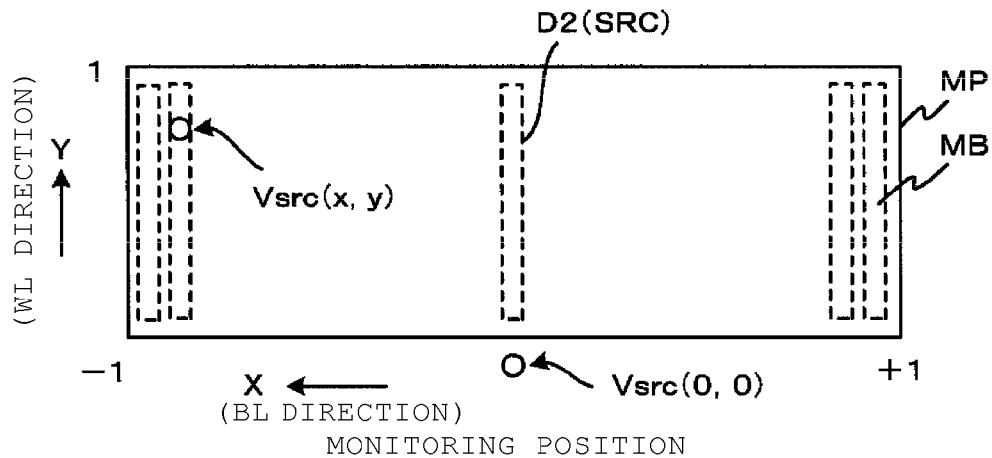
FIGS. 17A to 17C are diagrams showing a model of the voltage distribution of the source line according to the first embodiment.
Figure 17B:
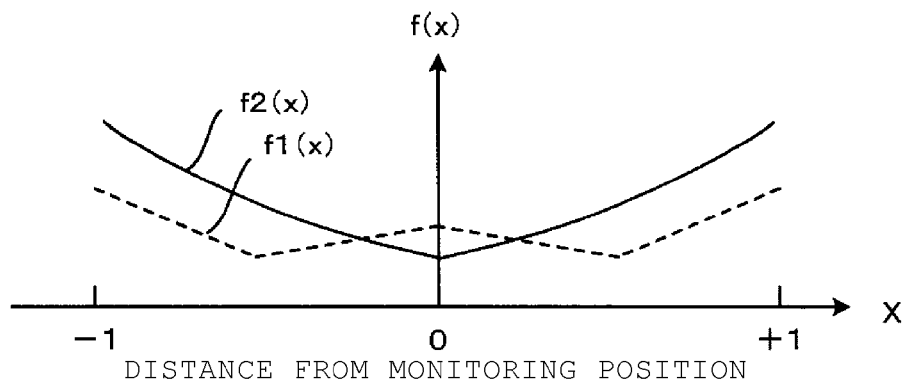
Figure 17C:
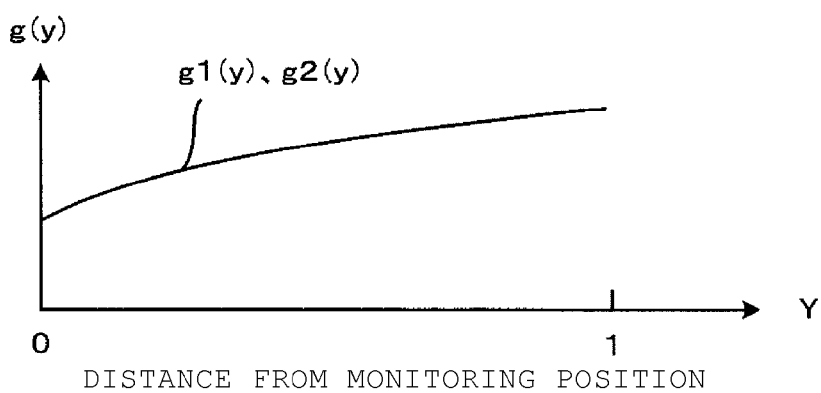

FIGS. 17A to 17C are diagrams for describing a simulation method of the in-plane distribution of the source line voltage, FIG. 17A is a diagram showing a definition of X and Y coordinates in the memory plane MP, FIG. 17B is a diagram schematically showing the function in which the voltage distribution in a X direction is expressed, and FIG. 17C is a diagrams schematically showing the function in which the voltage distribution in a Y direction is expressed.

As shown in FIG. 17A, the bit line BL direction is set as the X axis and the word line WL direction is set as the Y axis. The source line monitoring position N0 is set to an original point (0, 0) of x and y coordinates. The source line voltage Vsrc (x and y) in a position (x and y) within one memory plane MP can be approximated by the sum of a function f(x) of a distance x from the original point (0, 0) and a function g(y) of a distance y. The source line voltage Vsrc is expressed by the following equation.

$$Vsrc(x,y)=f(x)+g(y)$$

As shown in FIG. 17B, the function f2(x) of the comparative example monotonically increases in symmetry toward both ends from the original point and draws the curve of a lower convex. On the other hand, the function f1(x) of the present embodiment monotonically increases toward one end and the center from the middle and draws a W-type curve.

On the other hand, as shown in FIG. 17C, the function g2(y) of the comparative example monotonically increases toward an end from the original point and draws the curve of an upper convex. The function g1(x) of the present embodiment is substantially the same as the function g2(y).

Figure 18A:
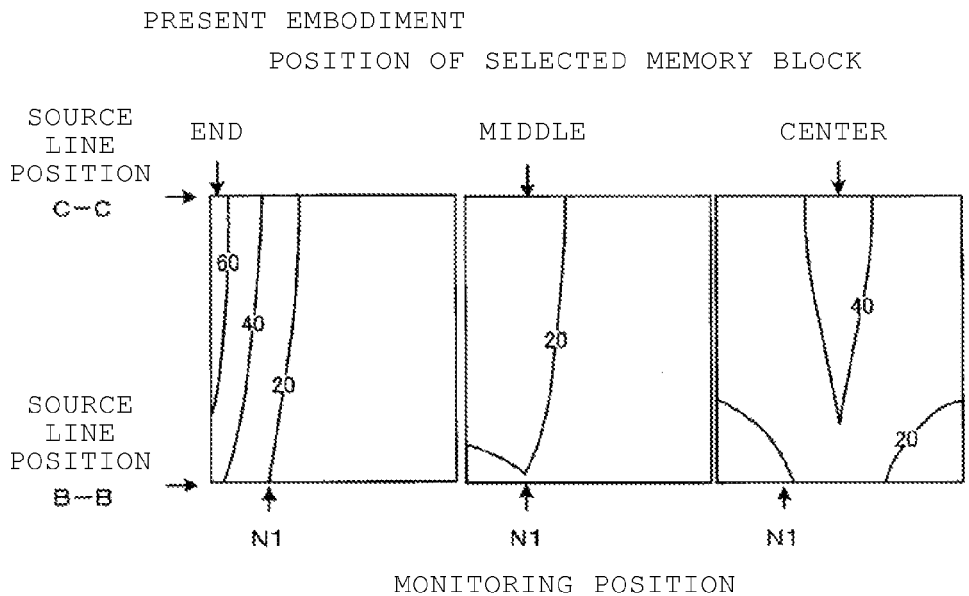
FIGS. 18A and 18B are contour maps showing the voltage distribution of the source line according to the first embodiment in contrast with the comparative example.
Figure 18B:
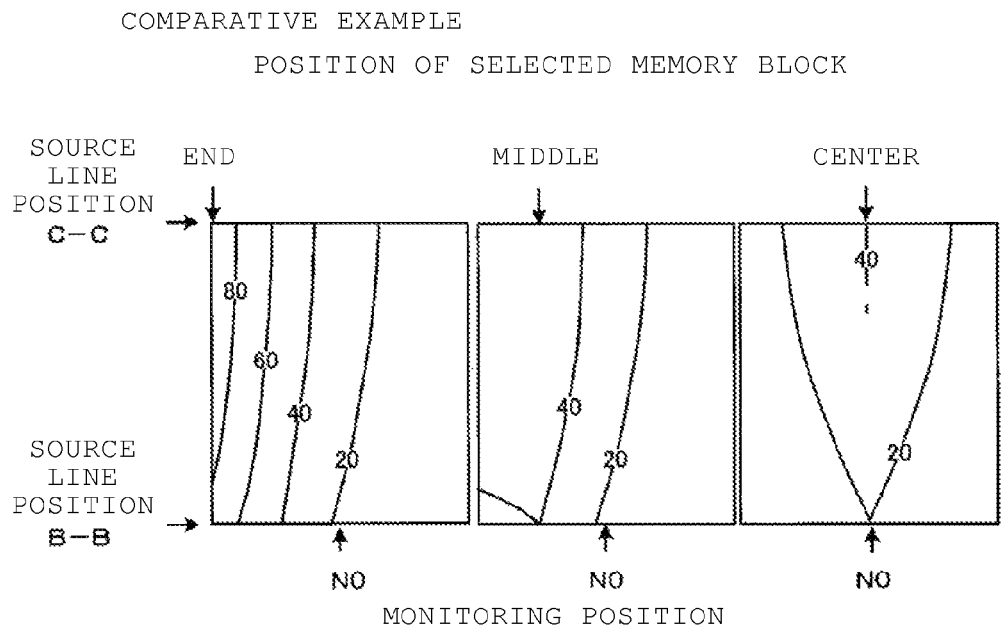

FIGS. 18A and 18B are contour maps showing the result in which the in-plane distribution of the source line voltage Vsrc is simulated, FIG. 18A is a contour map of the present embodiment, and FIG. 18B is a diagram showing the contour map of the comparative example. An interval of a contour line is 20 mV in FIGS. 18A and 18B. The parameter is the position of the selected memory block MB.

As shown in FIG. 18B, in a case of the in-plane distribution of the source line voltage of the comparative example, the voltage Vsrc of the source line at one end side becomes higher as the selected memory block MB is moved to the middle and one end from the center. The voltage of the source line, which is in the farthest position from the source line monitoring position N0, is highest. The in-plane distribution of the source line voltage changes depending on the position of the selected memory block MB.

On the other hand, as shown in FIG. 18A, the in-plane distribution of the source line voltage of the present embodiment shows the distribution so that the in-plane distribution of the source line voltage of the comparative example is shifted to one end side in response to a shift of the source line monitoring position from N0 to N1.

This is because the range of a distance x, which is from the source line monitoring position to the selected memory block MB, contracts. As a result, uniformity is improved compared to that of the comparative example in the in-plane distribution of the source line voltage Vsrc.

The bit line voltage Vbl at the time of reading is considered. If the memory block MB at the end is selected, the voltage Vsrc of the source line D2 (SRC) becomes highest. Also in this case, the bit line voltage Vbl is set so that the appropriate voltage (difference between bit line voltage and source line voltage) through the memory string MS.

For example, if the memory block MB at the end is selected, the difference in voltage between the bit line voltage Vbl and the voltage of the source line D2 (SRC) is set to 0.5 v. If the memory block MB at the center is selected, since the difference between the bit line voltage Vbl and the voltage of the source line D2 (SRC) is 0.5 v or more, the cell current increases. This simply shows that power consumption increases.

Accordingly, it is preferable that the voltage Vsrc of the source line be constant all the time regardless of the position of the selected memory block MB, but a selection block position dependence of the source line voltage Vsrc inevitably occurs by the wiring resistance of the source line.

In the present embodiment, since the selection block position dependence of the source line voltage Vsrc is suppressed, it is possible to lower the bit line voltage Vbl by just that much. Accordingly, it is possible to reduce the power consumption.

In addition, even if bit line voltage Vbl is not lowered, since it is possible to improve the worst value of the source line voltage Vsrc, it is possible to achieve a reduction of cell array size by narrowing the width of the source line shunt 46 by just that much, and expanding the second pitch, and the like.

As described above, in the non-volatile semiconductor memory device 10 of the present embodiment, the source line control circuit 11 includes the source line monitoring position selection circuit 21 and the source line voltage control circuit 22.

The source line monitoring position selection circuit 21 selects the source line monitoring position N1 or a source line monitoring position N2 in response to the position of the selected memory block MB. The source line voltage control circuit 22 drives the source line driver 20 in the selected source line monitoring position N1 or the selected source line monitoring position N2 so that the source line voltage Vsrc is equal to the reference voltage Vref.

As a result, since the memory block MB position dependence of the source line voltage Vsrc is decreased, the maximum value of the float Vu of the source line becomes smaller. It is possible to lower the bit line voltage Vbl, which is set according to the maximum value of the float Vu of the source line, by just that much.

It is possible to suppress the excessive cell current which flows through the selected memory block MB by lowering the bit line voltage Vbl. Accordingly, the non-volatile semiconductor memory device with low power consumption can be obtained.

Here, description is given with regard to a case where the source line monitoring positions N1 and N2 are at the center and the middle (¼ distance of entire length from end), but the source line monitoring position is not particularly limited. The source line monitoring position may be shifted from the middle.

For example, if the memory block MB at the end is selected and if the memory block MB at the center is selected, it is possible to adjust the source line monitoring position so that the float of the source line is equal.

Figure 19:
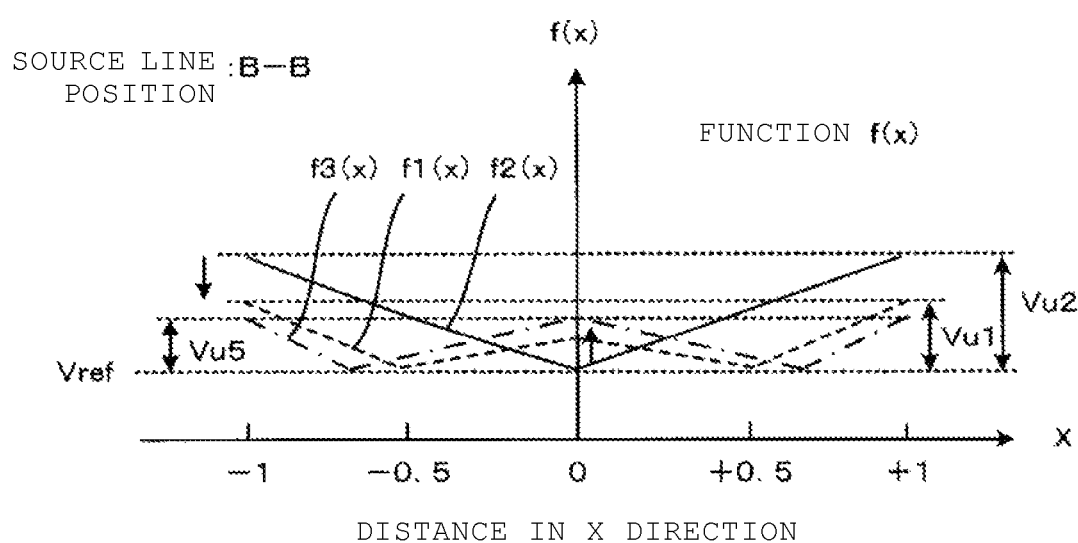
FIG. 19 is a diagram showing a function in which the voltage distribution of the source line is expressed according to the first embodiment.

FIG. 19 is a diagram which schematically shows the relation of the source line monitoring position and the function f(x) in which the voltage distribution of the source line in the X direction is expressed. In FIG. 19, the solid line shows the function f2(x) of the comparative example. The dashed-line shows the function f1(x) of the present embodiment. The dashed-dotted line shows a function f3(x) when source line monitoring position is closer to the end than the middle. The functions f1(x) and f2(x) are the functions f1(x) and f2(x) which are shown in FIG. 17B.

As shown in FIG. 19, the source line voltage at the center increases and the source line voltage at the end decreases as the source line monitoring position is moved from the center to the end. The source line voltage at the end is still higher than the source line voltage at the center in the function f2(x) when the source line monitoring position is in the middle.

If the memory block MB at the end is selected and if the memory block MB at the center is selected, it is possible to equalize a float Vu5 of the source line by further shifting the source line monitoring position from the middle to the end side.

As a result, since the bit line voltage Vbl is lowered by Vu1–Vu5, the excessive cell current is suppressed. It is possible to further reduce the power consumption.

Description is given with regard to a case where the boundary of the first region MP1 and the second region MP2 matches with the boundary of the memory block MB, but the boundary of the first region MP1 and the second region MP2 and the boundary of the memory block MB may not be matched with each other.

Figure 20:
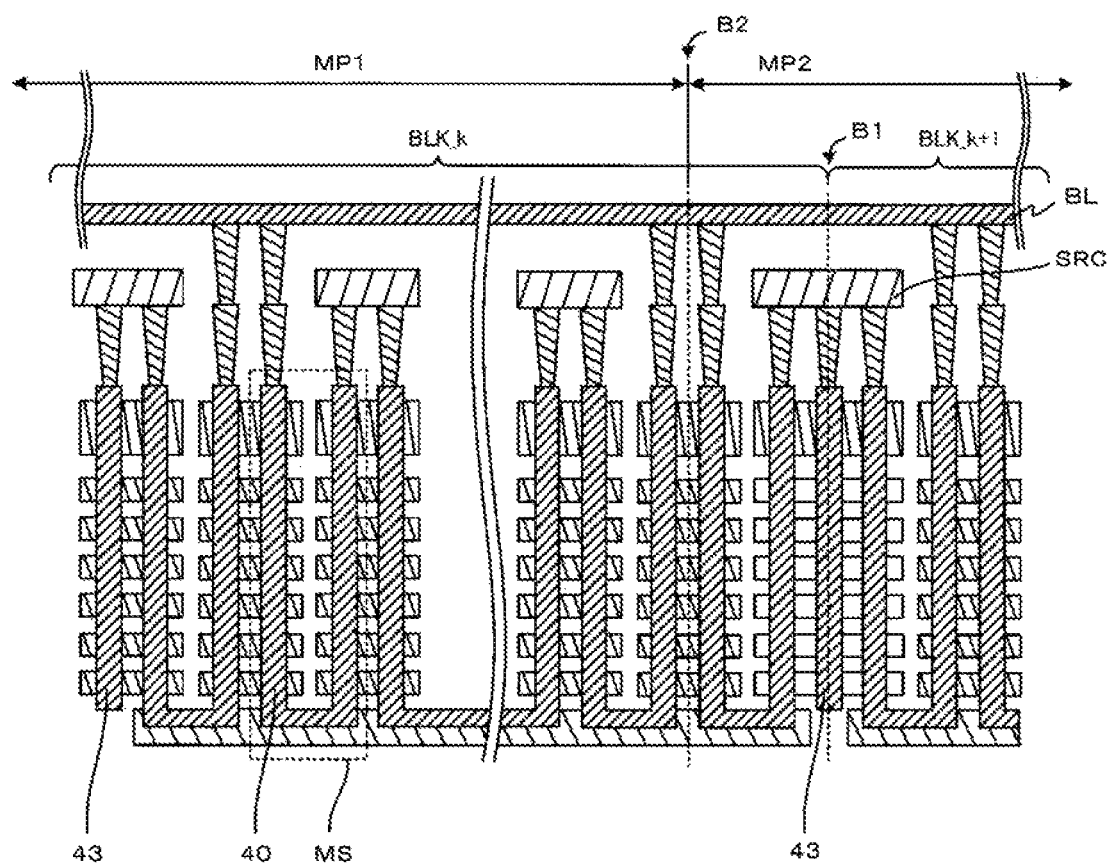
FIG. 20 is a diagram showing a boundary of other first and second regions of a memory plane according to the first embodiment.

FIG. 20 is a cross-sectional diagram of the memory cell array MA when the boundary of the first region MP1 and the second region MP2 and the boundary of the memory block MB are not matched with each other. As shown in FIG. 20, the boundary of the memory block BLK_k at the center and the memory block BLK_k+1 is set to B1, the boundary of the first region MP1 and the second region MP2 is set to B2.

The dummy columnar semiconductor layer 43 shown in FIG. 3 is provided on the boundary B1 of the memory block MB. The boundary B2 of the first region MP1 and the second region MP2 is determined by being shifted to one end side by one memory string MS from the boundary B2.

The number of the memory strings MS shifted is not particularly limited. That is, the position of the boundary B2 of the first region MP1 and the second region MP2 is not particularly limited. Since the memory string MS is a minimum unit for reading the data, the position of the boundary B2 may be anywhere between the memory strings MS which is adjacent. Accordingly, it is possible to more precisely set the position of the boundary B2.

Even if the boundary B1 of the memory block MB and the boundary B2 of the first region MP1 and the second region MP2, are not matched with each other, failure does not occur in particular.

Second Embodiment

Figure 21:
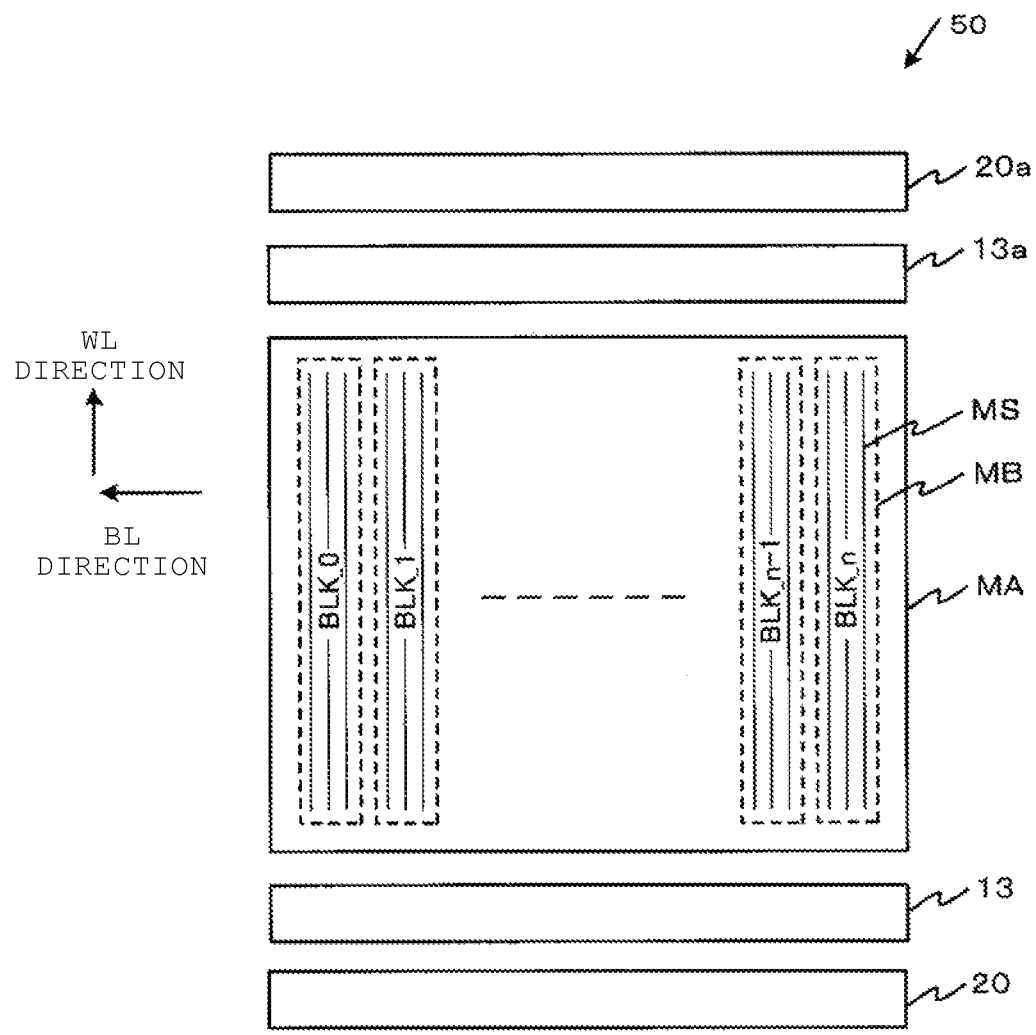
FIG. 21 is a block diagram which shows a peripheral circuit including another memory cell array of the non-volatile semiconductor memory device according to a second embodiment.
Figure 22:
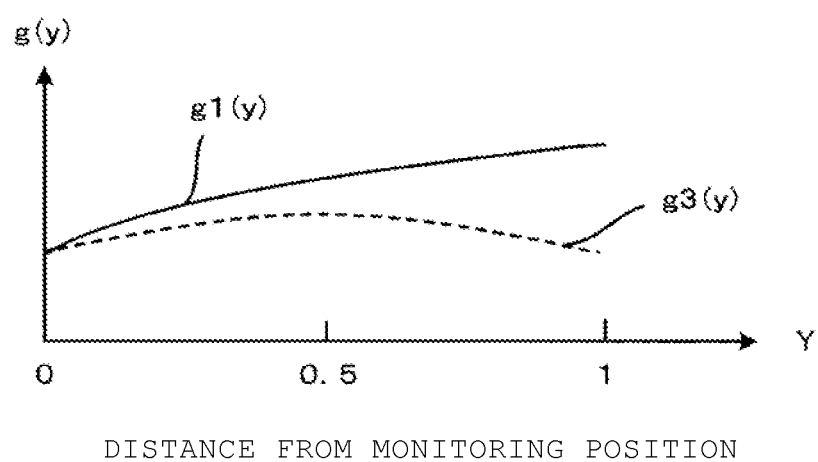
FIG. 22 is a diagram showing a model of the voltage distribution of the source line according to the second embodiment.

Description will be given with regard to a non-volatile semiconductor memory device according to a second embodiment using FIGS. 21 and 22. FIG. 21 is a block diagram which shows a peripheral circuit including the memory cell array of the non-volatile semiconductor memory device of the present embodiment, and FIG. 22 is a diagram showing a model of the voltage distribution of the source line.

In the present embodiment, the same reference numerals are given to the same configuration parts as the above-described first embodiment. Therefore, the description of such parts will not be repeated. Different parts will be described. The difference between the present embodiment and the first embodiment is that the source line drivers are disposed on both sides of the memory cell array.

As shown in FIG. 21, a source line driver 20a is disposed on the other side of the memory cell array MA interposing the row decoder 13a therebetween, in a non-volatile semiconductor memory device 50 of the present embodiment. The source line driver 20a has the same configuration as the source line driver 20. The source line driver 20a includes the plurality of the MOS transistors STr in which the gate electrode shown in FIG. 7 is connected in common.

In the source line driver 20a, the plurality of the MOS transistors STr are respectively connected to other ends (source line position C-C side) of the plurality of the source line D2 (SRC). The gate electrode of the MOS transistor STr is connected to the output terminal of the source line voltage control circuit 22.

The source line voltage control circuit 22 drives the MOS transistor STr of the source line driver 20 and the MOS transistor STr of the source line driver 20a at the same time. As a result, first and second current paths are formed.

The first current path is a current path in which the cell current flows to a ground terminal GND from the source line D2 (SRC) through the source line driver 20. The second current path is a current path in which the cell current shown in FIG. 7 flows to a ground terminal GND from the source line D2 (SRC) through the source line driver 20a.

Since the cell current is shunted to the first and the second current paths, the wiring resistance Rsrc2 shown in FIG. 14 in the word line WL direction is substantially ½. For example, if the memory block BLK3 shown in FIG. 14 in the center of the memory plane MP is selected and the cell current flows through the memory string MS in the center of the memory block BLK3, the cell current is halved to the current which flows through the source line driver 20a and the current which flows through the source line driver 20.

In addition, if the cell current flows through the memory string MS except the center of the memory block BLK3, the cell current preferentially flows through a closer driver of the source line drivers 20 or 20a.

FIG. 22 is a diagram showing a function g3(y) in which the voltage distribution of the source line of the present embodiment is expressed by contrast with the functions g1(y) and g2(y) in which the voltage distribution of the source line of the first embodiment shown in FIG. 17C. As illustrated in FIG. 22, the function g3(y) of the present embodiment draws the curve of the upper convex and becomes smaller than the voltage distribution function g1(y).

As a result, since the maximum value of the float of the source line in the Y direction is decreased, it is possible to further decrease the power consumption.

As described above, the source line drivers 20 and 20a are disposed along both sides of the memory cell array MA along the word line direction, and is connected to both sides of the source line D2 (SRC) in the non-volatile semiconductor memory device 50 of the present embodiment.

As a result, since the first and second current paths are formed, the wiring resistance Rsrc2 in the word line WL direction is substantially ½. Accordingly, there is an advantage to be able to decrease the maximum value of the float of the source line in the Y direction to thereby further decreasing the power consumption.

Here, description is given with regard to a case where the two source line drivers are disposed on both sides of the memory cell array MA, but a plurality of source line drivers may be dispersedly disposed along the word line WL direction of the memory cell array MA.

For example, it is possible to electrically connect three source line drivers to both ends and the center of the source line D2 (SRC) by disposing the three source line drivers on both sides and the center of the memory call array MA along the word line direction.

As a result, since the function g3(y) in which the voltage distribution of the source line is expressed draws a reverse W-shaped curve, it is possible to further decrease the power consumption by further decreasing the maximum value of the float of the source line in the Y direction.

Third Embodiment

Figure 23:
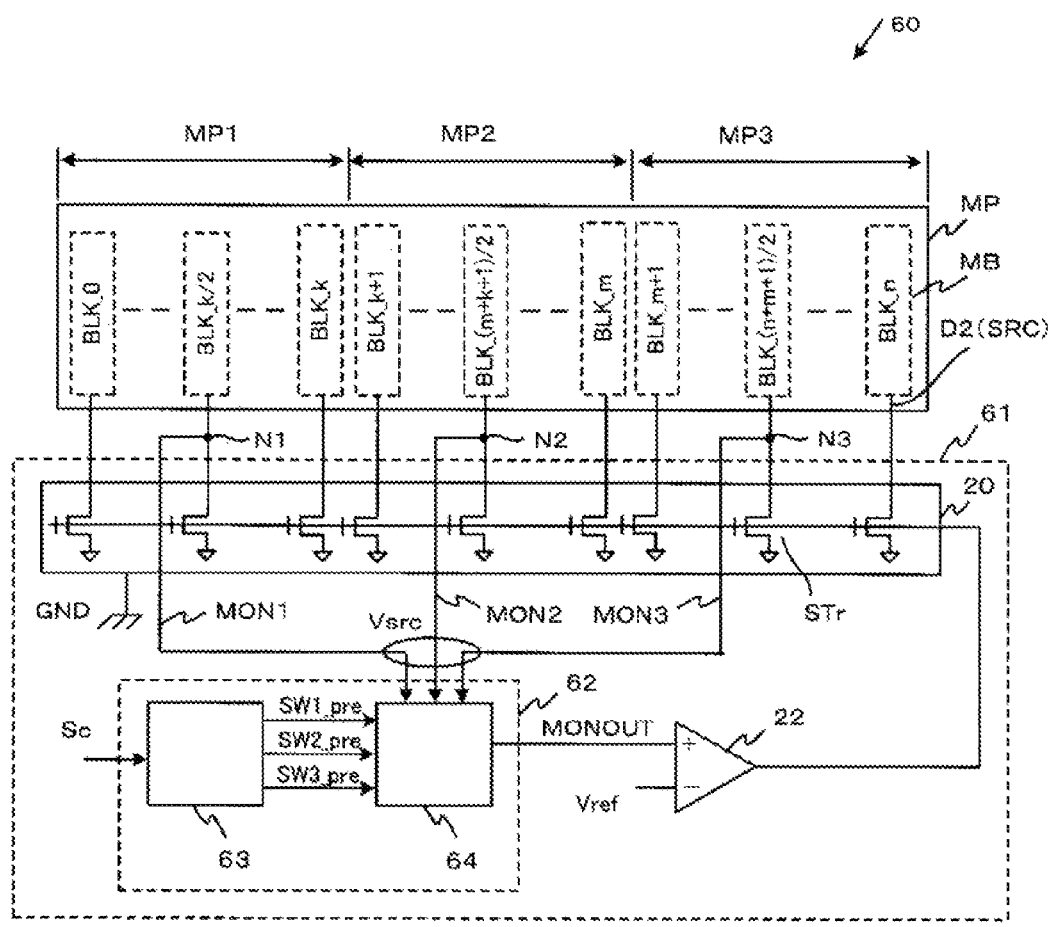
FIG. 23 is a diagram showing the source line control circuit of the non-volatile semiconductor memory device according to a third embodiment.
Figures 24, 25:
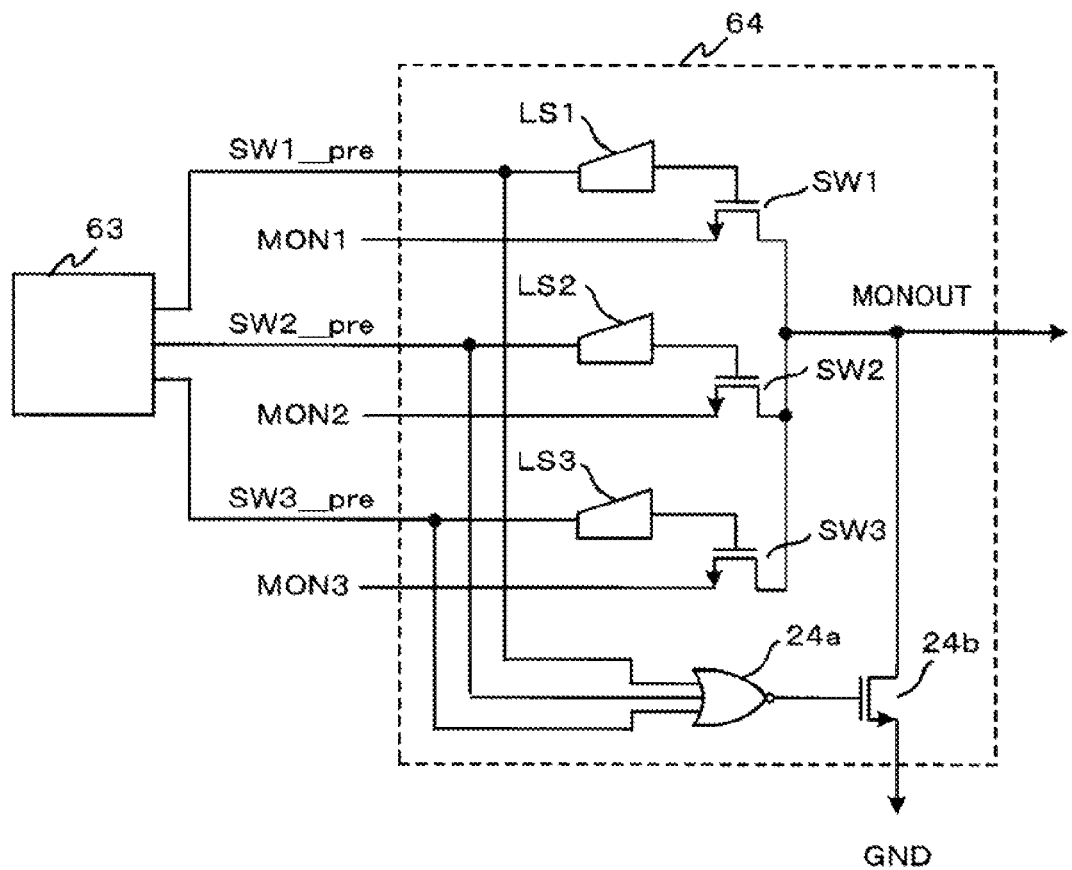
FIG. 24 is a diagram showing a decode result of the source line monitoring position selection circuit according to the third embodiment.
FIG. 25 is a diagram showing a switch circuit of the source line monitoring position selection circuit according to the third embodiment.

Description will be given with regard to a non-volatile semiconductor memory device according to a third embodiment using FIGS. 23 to 25. FIG. 23 is a diagram showing the source line control circuit of the non-volatile semiconductor memory device of the present embodiment, FIG. 24 is a diagram showing the decode result of the decode circuit, and FIG. 25 is a diagram showing the switch circuit.

In the present embodiment, the same reference numerals are given to the same configuration parts as the above-described first embodiment. Therefore, the description of such parts will not be repeated. Different parts will be described. The difference between the present embodiment and the first embodiment is that the memory plane MP is divided into three regions.

As illustrated in FIG. 23, the memory plane MP is divided into the first region MP1, the second region MP2, and a third region MP3 in a non-volatile semiconductor memory device 60 of the present embodiment. The memory blocks BLK_0 to BLK_k are disposed in the first region MP1, the memory blocks BLK_k+1 to BKL_m are disposed in the second region MP2, and memory blocks BLK_m+1 to BKL_n are disposed in the third region MP3.

The source line D2 (SRC) of the memory block BLK_k/2, which is positioned in the middle of the memory blocks BLK_0 and BLK_k positioned at both ends in the first region MP1, and the monitor wiring MON1 are connected at the connection node N1.

The source line D2 (SRC) of the memory block BLK_(m+k+1)/2, which is positioned in the middle of the memory blocks BLK_k+1 and BLK_m positioned at both ends in the second region MP2, and the monitor wiring MON2 are connected at the connection node N2.

The source line D2 (SRC) of the memory block BLK_(n+m+1)/2, which is positioned in the middle of the memory blocks BLK_m+1 and BLK_n positioned at both ends in the third region MP3, and the monitor wiring MON3 are connected at a connection node N3.

A source line control circuit 61 includes a decode circuit 63 and a switch circuit 64. The decode circuit 63 decodes block address signals Sc which specify the memory block MB to be selected and outputs decode results SW1_pre, SW2_pre, and SW3_pre which show that the selected memory block MB to be selected is in any one of the MP1, the MP2, or the MP3, which are the first region to the third region respectively.

As illustrated in FIG. 24, when the selected memory block MB is any one of the memory blocks BLK_0 to BLK_k in the first region MP1, the decode result SW1_pre is set to the high level and the decode results SW2_pre and SW3_pre are set to the low level.

When the selected memory block MB is any one of the memory blocks BLK_k+1 to BLK_m in the second region MP2, the decode result SW2_pre is set to the high level and the decode results SW1_pre and SW3_pre are set to the low level.

When the selected memory block MB is any one of the memory blocks BLK_m+1 to BLK_n in the third region MP3, the decode result SW3_pre is set to the high level and the decode results SW1_pre and SW2_pre are set to the low level.

When the selected memory block MB is none of the memory blocks, the decode results SW1_pre, SW2_pre, and SW3_pre are all set to the low level.

As shown in FIG. 25, the switch circuit 64 includes a switch element SW3 in addition to the switch elements SW1 and SW2. The switch element SW3 is an n-type MOS transistor.

The source electrode is connected to the monitor wiring MON3 and inputs the decode result SW3_pre to a gate electrode through a level shift circuit LS3 in the switch element SW3. Three drain electrodes are connected to each other. The level shift circuit LS3 is used for matching the voltage level of the decode result SW3_pre with an operation level of a p-type MOS transistor.

The switch circuit 64 operates as follows. When the decode result SW1_pre is at a high level, the switch element SW1 is turned on, and the switch elements SW2 and SW3 are turned off. When the decode result SW2_pre is at a high level, the switch element SW2 is turned on, and the switch elements SW1 and SW3 are turned off. When the decode result SW3_pre is at a high level, the switch element SW3 is turned on, and the switch elements SW1 and SW2 are turned off.

When the memory blocks BLK_0 to BLK_k are selected, the monitor wiring MON1 is connected to the non-inversion input terminal of the source line voltage control circuit 22. When the memory blocks BLK_k+1 to BLK_m are selected, the monitor wiring MON2 is connected to the non-inversion input terminal of the source line voltage control circuit 22. When the memory blocks BLK_m+1 to BLK_n are selected, the monitor wiring MON3 is connected to the non-inversion input terminal of the source line voltage control circuit 22.

As described above, in the present embodiment, since the memory plane MP is divided into the MP1, the MP2, and the MP3, which are the first to third regions respectively, it is possible to further decrease an amount of the float Vu of the source line voltage.

Here, description is given with regard to a case where the memory plane MP is divided into three regions, but the memory plane MP may be divided into four or more regions. For example, when the memory plane MP is divided into the n (n≥4) regions, the monitor wiring is connected to the source line D2 (SRC) of the memory block which is positioned in the middle of the memory blocks positioned at both ends, in each of regions of from a fourth region to an nth region.

The decode circuit outputs the decode result which shows any region selected from among the first region to the nth region in the source line control circuit. The switch circuit connects the monitor wiring in the selected region to the non-inversion input terminal of the source line voltage control circuit 22.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

Moreover, configurations which are described in the following notes can be considered.

The configuration of the memory cell array, for example, is described in U.S. patent application Ser. No. 12/407, 403 entitled "three-dimensional stack nonvolatile semiconductor memory", filed on Mar. 19, 2009. In addition, the configuration of the memory cell array is described in U.S. patent application Ser. No. 12/406,524 entitled "three-dimensional stack nonvolatile semiconductor memory", filed on Mar. 18, 2009, is described in U.S. patent application Ser. No. 12/679, 991 entitled "non-volatile semiconductor memory device and manufacturing method of the same", filed on Mar. 25, 2010, and is described in U.S. patent application Ser. No. 12/532, 030 entitled "semiconductor memory and method of manufacturing the same", filed on Mar. 23, 2009. All of these patents applications are incorporated herein by reference in their entirety.

What is claimed is:

1. A non-volatile semiconductor memory device comprising:
   a memory array including a plurality of memory cell transistors electrically connected between bit lines and source lines, wherein the memory array is partitioned into a plurality of memory blocks;
   a source line driver configured to set a voltage level of the source lines to a reference voltage level;
   a first wiring that is electrically connected to a first monitoring position of the source lines;
   a second wiring that is electrically connected to a second monitoring position of the source lines different from the first monitoring position;
   a selection circuit configured to select one of a plurality of monitoring positions including the first monitoring position and the second monitoring position; and
   a source line voltage control circuit configured to compare a source line voltage of a selected monitoring position with a reference voltage, and output a result to the source line driver.

2. The device according to claim 1, further comprising:
   a third wiring that is electrically connected to a third monitoring position different from the first and second monitoring positions,
   wherein the selection circuit is configured to select one of the first, second, and third monitoring positions.

3. The device according to claim 1, wherein each of the memory blocks comprises a plurality of memory strings, each including memory cell transistors connected in series between one of the bit lines and one of the source lines.

4. The device according to claim 3, wherein the source lines comprise:
   first source lines, each of which is respectively connected to one of the memory strings;
   second source lines disposed above the first source lines and electrically connected to the first source lines; and
   third source lines disposed above the second source lines and electrically connected to the second source lines,
   wherein the first and second monitoring positions are located on different ones of the third source lines.

5. The device according to claim 4, wherein the third source lines are respectively provided for each of the memory blocks and are arranged in parallel along a bit line direction, and the first monitoring position is selected to be near the middle of a first group of third source lines and the second monitoring position is selected to be near the middle of a second group of third source lines.

6. The device according to claim 5, wherein the number of third source lines in the first group is equal to the number of third source lines in the second group.

7. The device according to claim 5, wherein the number of third source lines in the first group is different from the number of third source lines in the second group.

8. The device according to claim 5, wherein the selection circuit is configured to select the first monitoring position when a memory block corresponding to a third source line in the first group is selected and to select the second monitoring position when a memory block corresponding to a third source line in the second group is selected.

9. The device according to claim 5, wherein the source line driver includes a plurality of transistors, one for each of the third source lines and sets the voltage level of the source lines to the reference voltage level with the transistors.

10. A non-volatile semiconductor memory device comprising:
    a memory array including a plurality of memory cell transistors electrically connected between bit lines and source lines, wherein the memory array is partitioned into a plurality of memory blocks;
    first and second source line drivers disposed on opposite sides of the memory array and configured to set a voltage level of the source lines to a reference voltage level;
    a first wiring that is electrically connected to a first monitoring position of the source lines;
    a second wiring that is electrically connected to a second monitoring position different from the first monitoring position of the source lines;
    a selection circuit configured to select one of a plurality of monitoring positions including the first monitoring position and the second monitoring position; and
    a source line voltage control circuit configured to compare a source line voltage of a selected monitoring position with the reference voltage, and output a result to the first and second source line drivers.

11. The device according to claim 10, wherein each of the memory blocks comprises a plurality of memory strings, each including memory cell transistors connected in series between one of the bit lines and one of the source lines.

12. The device according to claim 11, wherein the source lines comprise:
    first source lines, each of which is respectively connected to one of the memory strings;
    second source lines disposed above the first source lines and electrically connected to the first source lines; and
    third source lines disposed above the second source lines and electrically connected to the second source lines,
    wherein the first and second monitoring positions are located on different ones of the third source lines.

13. The device according to claim 12, wherein the third source lines are respectively provided for each of the memory blocks and are arranged in parallel along a bit line direction and connected at a first end to the first source line driver and a second end to the second source line driver.

14. The device according to claim 13, wherein the first monitoring position is selected to be near the middle of a first group of third source lines and the second monitoring position is selected to be near the middle of a second group of third source lines.

15. The device according to claim 14, wherein the selection circuit is configured to select the first monitoring position when a memory block corresponding to a third source line in the first group is selected and to select the second monitoring position when a memory block corresponding to a third source line in the second group is selected.

16. The device according to claim 13, wherein the first and second source line drivers each include a plurality of transistors, one for each of the third source lines and sets the voltage level of the source lines to the reference voltage level with the transistors.

17. A method of setting a voltage level of source lines in a non-volatile semiconductor memory device including a plurality of memory cell transistors that are electrically connected between bit lines and the source lines and are partitioned into a plurality of memory blocks, said method comprising:

selecting a monitoring position from one of a plurality of monitoring positions including a first monitoring position and a second monitoring position that is different from the first monitoring position;

comparing a source line voltage of the selected monitoring position with a reference voltage and outputting a result; and setting a voltage level of the source lines in accordance with the result.

18. The method of claim 17, wherein the monitoring position is selected from the first monitoring position, the second monitoring position, and a third monitoring position that is different from the first and second monitoring positions.

19. The method of claim 17, further comprising:

selecting one of the memory blocks for a read or write operation, wherein the monitoring position is selected based on a relative proximity of the first and second monitoring positions with respect to the selected memory block.

20. The method of claim 17, wherein the voltage level of the source lines are set using first and second source line drivers located on opposite sides of the source lines.

* * * * *